(12) United States Patent
O'Brien et al.

(10) Patent No.: US 7,769,229 B2
(45) Date of Patent: Aug. 3, 2010

(54) PROCESSING IMAGES HAVING COLOR AND PANCHROMATIC PIXELS

(75) Inventors: Michele O'Brien, Rochester, NY (US); Bruce H. Pillman, Rochester, NY (US); John F. Hamilton, Jr., Rochester, NY (US); Amy D. Enge, Spencerport, NY (US); Thomas E. DeWeese, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 916 days.

(21) Appl. No.: 11/565,140

(22) Filed: Nov. 30, 2006

(65) Prior Publication Data

US 2008/0130991 A1 Jun. 5, 2008

(51) Int. Cl.
G06K 9/00 (2006.01)
(52) U.S. Cl. .................... 382/167; 382/162; 382/284
(58) Field of Classification Search .............. 382/166, 382/154, 284, 106, 167, 293, 302, 299, 164, 382/162; 356/405; 348/180, E3.018; 250/226; 345/501
See application file for complete search history.

(56) References Cited

U.S. PATENT DOCUMENTS

| | | | |
|---|---|---|---|
| 4,390,895 A | 6/1983 | Sato et al. ............... 348/276 |
| 4,807,981 A | 2/1989 | Takizawa et al. ............ 359/498 |
| 4,823,186 A | 4/1989 | Muramatsu ................ 348/236 |
| 5,172,220 A | 12/1992 | Beis ........................ 348/262 |
| 5,272,518 A * | 12/1993 | Vincent .................... 356/405 |
| 5,323,233 A | 6/1994 | Yamagami et al. .......... 348/277 |
| 5,432,906 A * | 7/1995 | Newman et al. ............ 345/501 |
| 5,493,335 A | 2/1996 | Parulski et al. ........... 348/231.6 |
| 6,246,865 B1 | 6/2001 | Lee .......................... 455/114.3 |
| 6,366,318 B1 | 4/2002 | Smith et al. ................ 348/272 |
| 6,476,865 B1 | 11/2002 | Gindele et al. ............. 348/277 |
| 6,512,838 B1 * | 1/2003 | Rafii et al. ................ 382/106 |
| 6,594,388 B1 * | 7/2003 | Gindele et al. ............. 382/167 |
| 7,379,588 B2 * | 5/2008 | Loce et al. ................ 382/166 |
| 2003/0210332 A1 | 11/2003 | Frame ..................... 348/216.1 |
| 2006/0044427 A1 | 3/2006 | Hu ........................... 348/266 |
| 2006/0113459 A1 | 6/2006 | Yang et al. ................ 348/241 |

FOREIGN PATENT DOCUMENTS

| | | |
|---|---|---|
| EP | 0138074 | 12/1989 |
| EP | 1 241 896 | 9/2002 |
| EP | 1 594 321 | 11/2005 |

* cited by examiner

*Primary Examiner*—Anh Hong Do
(74) *Attorney, Agent, or Firm*—Raymond L. Owens

(57) ABSTRACT

A method of processing an array of pixels captured by an image capture device, having a first two-dimensional array of pixels from the image capture device, some of which are color pixels, and some of which are panchromatic pixels; determining in response to ambient lighting conditions, whether panchromatic pixels are to be combined with color pixels; combining pixels to produce a second two-dimensional array of pixels which has fewer pixels than the first two-dimensional array of pixels; and correcting the color pixels.

14 Claims, 15 Drawing Sheets

PROCESSING IMAGES HAVING COLOR AND PANCHROMATIC PIXELS

CROSS REFERENCE TO RELATED APPLICATION

The present application is related to U.S. patent application Ser. No. 11/191,538, filed Jul. 28, 2005, entitled "Processing Color and Panchromatic Pixels" by Compton et al, the disclosure of which is incorporated herein.

FIELD OF THE INVENTION

This invention relates to providing a two-dimensional image having color and panchromatic pixels and reducing and processing image for further use.

BACKGROUND OF THE INVENTION

An electronic imaging system depends on an electronic image sensor to create an electronic representation of a visual image. Examples of such electronic image sensors include charge coupled device (CCD) image sensors and active pixel sensor (APS) devices (APS devices are often referred to as CMOS sensors because of the ability to fabricate them in a Complementary Metal Oxide Semiconductor process). Typically, these images sensors include a number of light sensitive pixels, often arranged in a regular pattern of rows and columns. For capturing color images, a pattern of filters is typically fabricated on the pattern of pixels, with different filter materials used to make individual pixels sensitive to only a portion of the visible light spectrum. The color filters necessarily reduce the amount of light reaching each pixel, and thereby reduce the light sensitivity of each pixel. A need persists for improving the light sensitivity, or photographic speed, of electronic color image sensors to permit images to be captured at lower light levels or to allow images at higher light levels to be captured with shorter exposure times.

Image sensors are either linear or two-dimensional. Generally, these sensors have two different types of applications. The two-dimensional sensors are typically suitable for image capture devices such as digital cameras, cell phones and other applications. Linear sensors are often used for scanning documents. In either case, when color filters are employed the image sensors have reduced sensitivity.

A linear image sensor, the KLI-4104 manufactured by Eastman Kodak Company, includes four linear, single pixel wide arrays of pixels, with color filters applied to three of the arrays to make each array sensitive to either red, green, or blue in its entirety, and with no color filter array applied to the fourth array; furthermore, the three color arrays have larger pixels to compensate for the reduction in light sensitivity due to the color filters, and the fourth array has smaller pixels to capture a high resolution monochrome image. When an image is captured using this image sensor, the image is represented as a high resolution, high photographic sensitivity monochrome image along with three lower resolution images with roughly the same photographic sensitivity and with each of the three images corresponding to either red, green, or blue light from the image; hence, each point in the electronic image includes a monochrome value, a red value, a green value, and a blue value. However, since this is a linear image sensor, it requires relative mechanical motion between the image sensor and the image in order to scan the image across the four linear arrays of pixels. This limits the speed with which the image is scanned and precludes the use of this sensor in a handheld camera or in capturing a scene that includes moving objects.

There is also known in the art an electronic imaging system described in U.S. Pat. No. 4,823,186 by Akira Muramatsu that includes two sensors, wherein each of the sensors includes a two-dimensional array of pixels but one sensor has no color filters and the other sensor includes a pattern of color filters included with the pixels, and with an optical beam splitter to provide each image sensor with the image. Since the color sensor has a pattern of color filters applied, each pixel in the color sensor provides only a single color. When an image is captured with this system, each point in the electronic image includes a monochrome value and one color value, and the color image must have the missing colors at each pixel location interpolated from the nearby colors. Although this system improves the light sensitivity over a single conventional image sensor, the overall complexity, size, and cost of the system is greater due to the need for two sensors and a beam splitter. Furthermore, the beam splitter directs only half the light from the image to each sensor, limiting the improvement in photographic speed.

In addition to the linear image sensor mentioned above, there are known in the art image sensors with two-dimensional arrays of pixels where the pixels include pixels that do not have color filters applied to them. For example, see Sato et al in U.S. Pat. No. 4,390,895, Yamagami et al in U.S. Pat. No. 5,323,233, and Gindele et al in U.S. Pat. No. 6,476,865. In each of the cited patents, the sensitivity of the unfiltered or monochrome pixels is significantly higher than the color pixels, requiring the application of gain to the color pixels in order to match the color and monochrome signals from the pixel array. Increasing gain increases noise as well as signal, causing degradation in the overall signal to noise ratio of the resulting image. Frame in U.S. Patent Application Publication 2003/0210332 discloses a pixel array with most of the pixels unfiltered, but the color pixels suffer from the same sensitivity deficit as mentioned above.

Noda in European Patent No. 0138074 describes a video camera system using both color and panchromatic pixels. In particular, Noda discloses image processing techniques for image sensors with W, Ye, Cy and W, Ye, Cy, G color filter array patterns where W (panchromatic), Ye (yellow), Cy (cyan), and G (green) pixels are used to provide a normal red, green, and blue color image. The weighting of different types of pixels is selected to minimize moiré patterns in the resultant image.

In U.S. Pat. No. 5,172,220, Beis discloses a surveillance camera that switches between gray scale (panchromatic) mode and color mode (using color pixels). In this case, the ambient illumination level is used as a global switch, simply selecting the panchromatic pixels for producing the output image when the ambient light level is low.

In U.S. Pat. No. 6,246,865, Lee discloses combination of panchromatic and color pixels to produce an image with higher dynamic range than can be captured with only the color pixels or panchromatic pixels, using the color pixels to estimate an interpolated luminance signal in portions of the image where panchromatic pixels are clipped.

For many image capture devices, the full sensor resolution exceeds the number of pixels that can be read out at normal video frame rates, and thus some form of subsampling must be used to achieve video frame rates. One way of achieving data reduction is by direct subsampling of the raw CFA data as described, for example, in U.S. Pat. No. 5,493,335 including one pattern based on 2×2 blocks of pixels. Another way of achieving data reduction is by analog combining the signals from two or more pixels before reading the CFA data from the sensor.

In U.S. Pat. No. 6,366,318, Smith discloses the generation of a regular array of CFA color values using an irregular array that was directly subsampled from a larger array of CFA color pixels.

Some prior art, such as U.S. Pat. No. 6,246,865, addresses high luminance conditions, when panchromatic pixels are clipped and the color pixels have good signal to noise ratio. Some prior art, such as U.S. Pat. No. 5,172,220, addresses very low luminance conditions. Under these conditions, the panchromatic pixels have a usable signal to noise ratio and the color pixels have an unacceptably low signal to noise ratio. There persists a need to provide an image capture system that provides improved image quality low resolution images from a two-dimensional sensor over a wide range of conditions.

SUMMARY OF THE INVENTION

It is therefore an object of the present invention to provide an improved way of correcting two-dimensional images captured by an image capture device that has panchromatic and color pixels.

This object is achieved by a method of processing an array of pixels captured by an image capture device, comprising:

(a) providing a first two-dimensional array of pixels from the image capture device, some of which are color pixels, and some of which are panchromatic pixels;

(b) determining in response to ambient lighting conditions, whether panchromatic pixels are to be combined with color pixels;

(c) combining pixels determined from step (b) to produce a second two-dimensional array of pixels which has fewer pixels than the first two-dimensional array of pixels; and (d) correcting the color pixels produced in step c.

An advantage of the present invention is improved image quality of an image captured by an image sensor having panchromatic and color pixels throughout a wide range of ambient lighting levels This and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

FIG. 6A is the interpolated panchromatic image for FIG. 4A;

FIG. 6B is the low-resolution color image corresponding to the cells in FIG. 4A and FIG. 5;

FIGS. 7A-C shows several ways of combining the pixels of FIG. 4A;

FIGS. 8A-E provides a minimal repeating unit of six pixels for a color filter array pattern of the present invention including several tiling arrangements and an alternative orientation for the minimal repeating unit;

FIG. 9A-C provides several minimal repeating units for color filter array patterns of the present invention that are variants of the minimal repeating unit of FIG. 8;

FIGS. 10A-F provides a minimal repeating unit of eight pixels for a color filter array pattern of the present invention and includes a tiling arrangement and variations with color pixels that have alternative color photoresponse characteristics, including primary color, complementary color, three color, and four color alternatives;

FIGS. 11A-B provides a minimal repeating unit for a color filter array of the present invention in which more than half the pixels have a panchromatic photoresponse;

DETAILED DESCRIPTION OF THE INVENTION

Because digital cameras employing imaging devices and related circuitry for signal capture and correction and for exposure control are well known, the present description will be directed in particular to elements forming part of, or cooperating more directly with, method and apparatus in accordance with the present invention. Elements not specifically shown or described herein are selected from those known in the art. Certain aspects of the embodiments to be described are provided in software. Given the system as shown and described according to the invention in the following materials, software not specifically shown, described or suggested herein that is useful for implementation of the invention is conventional and within the ordinary skill in such arts.

Figure 1:
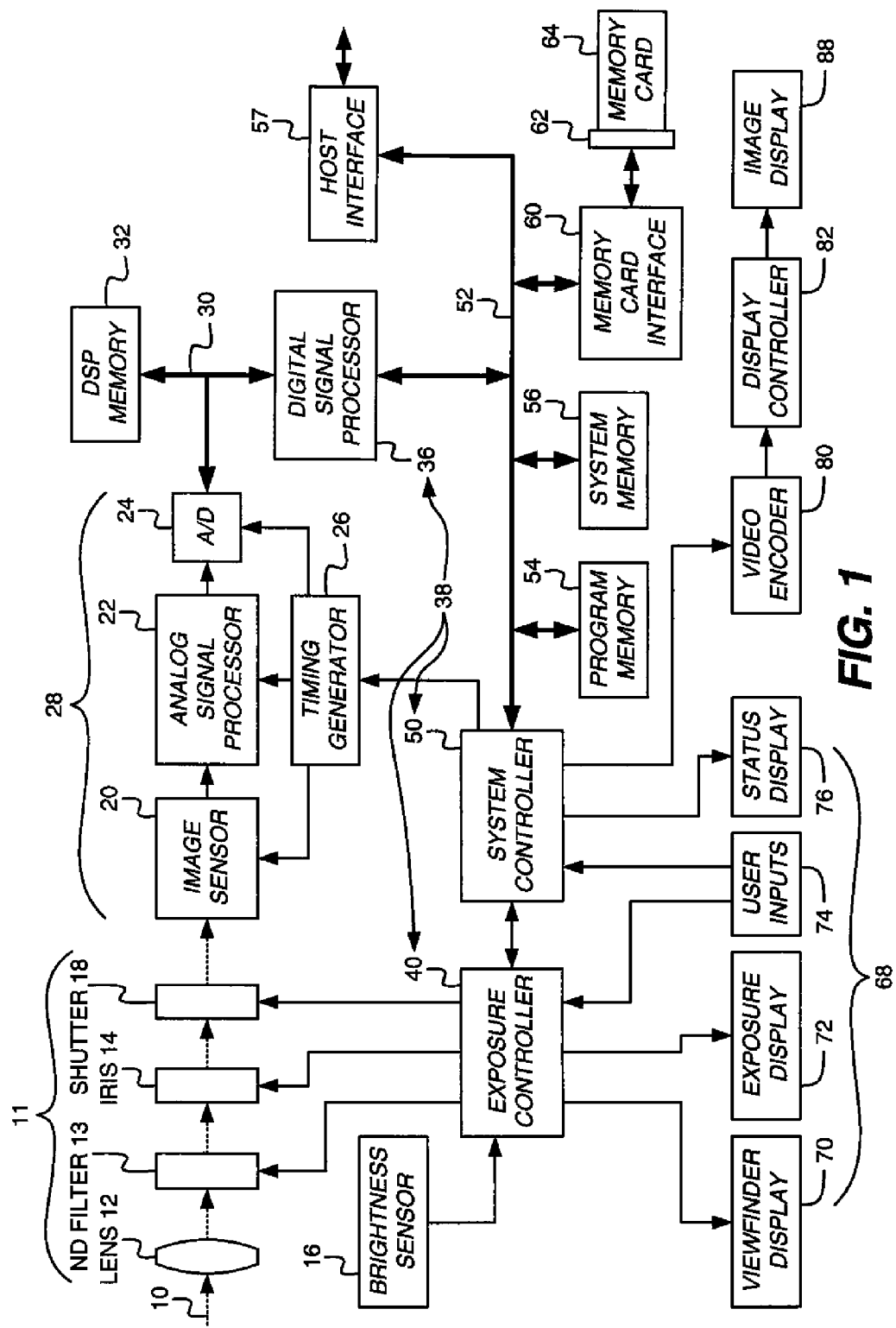
FIG. 1 is a block diagram of a digital still camera system that employs the method according to the present invention.

Turning now to FIG. 1, a block diagram of an image capture device shown as a digital camera embodying the present invention is shown. Although a digital camera will now be explained, the present invention is clearly applicable to other types of image capture devices. In the disclosed camera, light 10 from the subject scene is input to an imaging stage 11, where the light is focused by lens 12 to form an image on a solid state image sensor 20. Image sensor 20 converts the incident light to an electrical signal for each picture element (pixel). The image sensor 20 of the preferred embodiment is a charge coupled device (CCD) type or an active pixel sensor (APS) type (APS devices are often referred to as CMOS sensors because of the ability to fabricate them in a Complementary Metal Oxide Semiconductor process). Other types of image sensors having two-dimensional array of pixels are used provided that they employ the patterns of the present invention. The present invention also makes use of the image sensor 20 having a two-dimensional array of color and panchromatic pixels as will become clear later in this specification after FIG. 1 is described. Examples of the patterns of color and panchromatic pixels of the present invention that are used with the image sensor 20 are seen in FIGS. 4A-D, FIG. 8A, FIG. 8E, FIGS. 9A-C, FIG. 10A, FIGS. 10C-F, FIGS. 11A-B, FIG. 12, and FIG. 15, although other patterns are used within the spirit of the present invention.

The amount of light reaching the sensor 20 is regulated by an iris block 14 that varies the aperture and a neutral density (ND) filter block 13 that includes one or more ND filters interposed in the optical path. Also regulating the overall light level is the time that a shutter 18 is open. An exposure controller block 40 responds to the amount of light available in the scene as metered by a brightness sensor block 16 and controls all three of these regulating functions.

This description of a particular camera configuration will be familiar to one skilled in the art, and it will be obvious that many variations and additional features are present. For example, an autofocus system is added, or the lens are detachable and interchangeable. It will be understood that the present invention is applied to any type of digital camera, where similar functionality is provided by alternative components. For example, the digital camera is a relatively simple point and shoot digital camera, where the shutter 18 is a relatively simple movable blade shutter, or the like, instead of the more complicated focal plane arrangement. The present invention can also be practiced on imaging components included in non-camera devices such as mobile phones and automotive vehicles.

The analog signal from image sensor 20 is processed by analog signal processor 22 and applied to analog to digital (A/D) converter 24. A timing generator 26 produces various clocking signals to select rows and pixels and synchronizes the operation of analog signal processor 22 and A/D converter 24. An image sensor stage 28 includes the image sensor 20, the analog signal processor 22, the A/D converter 24, and the timing generator 26. The components of image sensor stage 28 are separately fabricated integrated circuits, or they are fabricated as a single integrated circuit as is commonly done with CMOS image sensors. The resulting stream of digital pixel values from A/D converter 24 is stored in a memory 32 associated with a digital signal processor (DSP) 36.

Digital signal processor 36 is one of three processors or controllers in this embodiment, in addition to a system controller 50 and an exposure controller 40. Although this partitioning of camera functional control among multiple controllers and processors is typical, these controllers or processors are combined in various ways without affecting the functional operation of the camera and the application of the present invention. These controllers or processors can include one or more digital signal processor devices, microcontrollers, programmable logic devices, or other digital logic circuits. Although a combination of such controllers or processors has been described, it should be apparent that one controller or processor is designated to perform all of the needed functions. All of these variations can perform the same function and fall within the scope of this invention, and the term "processing stage" will be used as needed to encompass all of this functionality within one phrase, for example, as in processing stage 38 in FIG. 1.

In the illustrated embodiment, DSP 36 manipulates the digital image data in its memory 32 according to a software program permanently stored in a program memory 54 and copied to memory 32 for execution during image capture. DSP 36 executes the software necessary for practicing image processing shown in FIG. 18. Memory 32 includes any type of random access memory, such as SDRAM. The bus 30 including a pathway for address and data signals connects DSP 36 to its related memory 32, A/D converter 24 and other related devices.

System controller 50 controls the overall operation of the camera based on a software program stored in program memory 54, which can include Flash EEPROM or other nonvolatile memory. This memory can also be used to store image sensor calibration data, user setting selections and other data which must be preserved when the camera is turned off. System controller 50 controls the sequence of image capture by directing exposure controller 40 to operate the lens 12, ND filter 13, iris 14, and shutter 18 as previously described, directing the timing generator 26 to operate the image sensor 20 and associated elements, and directing DSP 36 to process the captured image data. After an image is captured and processed, the final image file stored in memory 32 is transferred to a host computer via interface 57, stored on a removable memory card 64 or other storage device, and displayed for the user on an image display 88.

A system controller bus 52 includes a pathway for address, data and control signals, and connects system controller 50 to DSP 36, program memory 54, a system memory 56, host interface 57, a memory card interface 60 and other related devices. Host interface 57 provides a high speed connection to a personal computer (PC) or other host computer for transfer of image data for display, storage, manipulation or printing. This interface is an IEEE1394 or USB2.0 serial interface or any other suitable digital interface. Memory card 64 is typically a Compact Flash (CF) card inserted into memory card socket 62 and connected to the system controller 50 via memory card interface 60. Other types of storage that are utilized include without limitation PC-Cards, MultiMedia Cards (MMC), or Secure Digital (SD) cards.

Processed images are copied to a display buffer in system memory 56 and continuously read out via video encoder 80 to produce a video signal. This signal is output directly from the camera for display on an external monitor, or processed by display controller 82 and presented on image display 88. This display is typically an active matrix color liquid crystal display (LCD), although other types of displays are used as well.

A user interface 68, including all or any combination of a viewfinder display 70, an exposure display 72, a status display 76, the image display 88, and a user inputs 74, is controlled by a combination of software programs executed on exposure controller 40 and system controller 50. User inputs 74 typically include some combination of buttons, rocker switches, joysticks, rotary dials or touchscreens. Exposure controller 40 operates light metering, exposure mode, autofocus and other exposure functions. The system controller 50 manages the graphical user interface (GUI) presented on one or more of the displays, e.g., on image display 88. The GUI typically includes menus for making various option selections and review modes for examining captured images.

Exposure controller 40 accepts user inputs selecting exposure mode, lens aperture, exposure time (shutter speed), and exposure index or ISO speed rating and directs the lens and shutter accordingly for subsequent captures. Brightness sensor 16 is employed to measure the brightness of the scene and provide an exposure meter function for the user to refer to when manually setting the ISO speed rating, aperture and shutter speed. In this case, as the user changes one or more settings, the light meter indicator presented on viewfinder display 70 tells the user to what degree the image will be over or underexposed. In an automatic exposure mode, the user changes one setting and the exposure controller 40 automatically alters another setting to maintain correct exposure, e.g., for a given ISO speed rating when the user reduces the lens aperture the exposure controller 40 automatically increases the exposure time to maintain the same overall exposure.

The ISO speed rating is an important attribute of a digital still camera. The exposure time, the lens aperture, the lens transmittance, the level and spectral distribution of the scene illumination, and the scene reflectance determine the exposure level of a digital still camera. When an image from a digital still camera is obtained using an insufficient exposure, proper tone reproduction can generally be maintained by increasing the electronic or digital gain, but the image will contain an unacceptable amount of noise. As the exposure is increased, the gain is decreased, and therefore the image noise can normally be reduced to an acceptable level. If the exposure is increased excessively, the resulting signal in bright areas of the image can exceed the maximum signal level capacity of the image sensor or camera signal processing. This can cause image highlights to be clipped to form a uniformly bright area, or to bloom into surrounding areas of the image. It is important to guide the user in setting proper exposures. An ISO speed rating is intended to serve as such a guide. In order to be easily understood by photographers, the ISO speed rating for a digital still camera should directly relate to the ISO speed rating for photographic film cameras. For example, if a digital still camera has an ISO speed rating of ISO 200, then the same exposure time and aperture should be appropriate for an ISO 200 rated film/process system.

The ISO speed ratings are intended to harmonize with film ISO speed ratings. However, there are differences between electronic and film-based imaging systems that preclude exact equivalency. Digital still cameras can include variable gain, and can provide digital processing after the image data has been captured, enabling tone reproduction to be achieved over a range of camera exposures. It is therefore possible for digital still cameras to have a range of speed ratings. This range is defined as the ISO speed latitude. To prevent confusion, a single value is designated as the inherent ISO speed rating, with the ISO speed latitude upper and lower limits indicating the speed range, that is, a range including effective speed ratings that differ from the inherent ISO speed rating. With this in mind, the inherent ISO speed is a numerical value calculated from the exposure provided at the focal plane of a digital still camera to produce specified camera output signal characteristics. The inherent speed is usually the exposure index value that produces peak image quality for a given camera system for normal scenes, where the exposure index is a numerical value that is inversely proportional to the exposure provided to the image sensor.

The foregoing description of a digital camera will be familiar to one skilled in the art. It will be obvious that there are many variations of this embodiment that are possible and is selected to reduce the cost, add features or improve the performance of the camera. The following description will disclose in detail the operation of this camera for capturing images according to the present invention. Although this description is with reference to a digital camera, it will be understood that the present invention applies for use with any type of image capture device having an image sensor with color and panchromatic pixels.

The image sensor 20 shown in FIG. 1 typically includes a two-dimensional array of light sensitive pixels fabricated on a silicon substrate that provide a way of converting incoming light at each pixel into an electrical signal that is measured. As the image sensor 20 is exposed to light, free electrons are generated and captured within the electronic structure at each pixel. Capturing these free electrons for some period of time and then measuring the number of electrons captured, or measuring the rate at which free electrons are generated can measure the light level at each pixel. In the former case, accumulated charge is shifted out of the array of pixels to a charge to voltage measurement circuit as in a charge coupled device (CCD), or the area close to each pixel can contain elements of a charge to voltage measurement circuit as in an active pixel sensor (APS or CMOS sensor).

Whenever general reference is made to an image sensor in the following description, it is understood to be representative of the image sensor 20 from FIG. 1. It is further understood that all examples and their equivalents of image sensor architectures and pixel patterns of the present invention disclosed in this specification is used for image sensor 20.

In the context of an image sensor, a pixel (a contraction of "picture element") refers to a discrete light sensing area and charge shifting or charge measurement circuitry associated with the light sensing area. In the context of a digital color image, the term pixel commonly refers to a particular location in the image having associated color values.

Figures 2, 3:
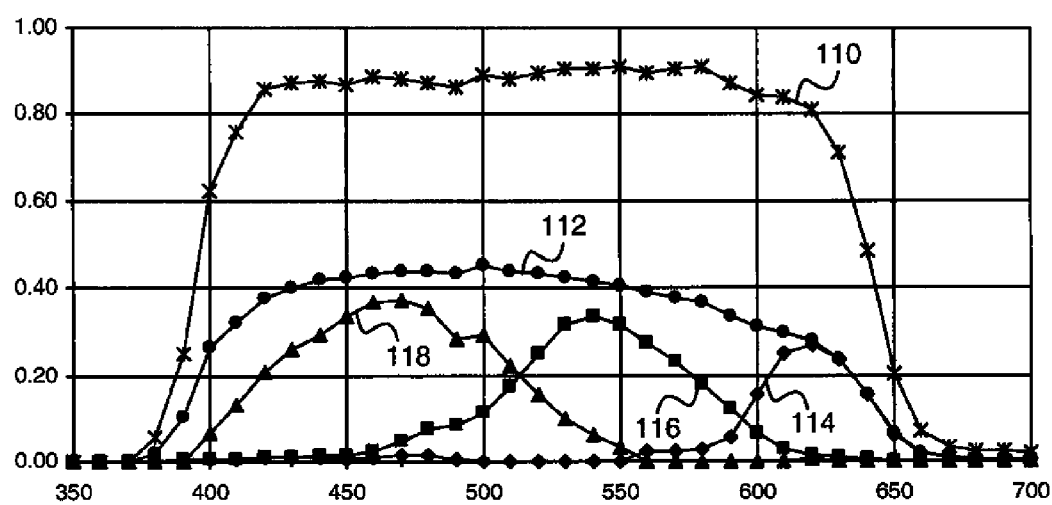
FIG. 2 is a conventional prior art Bayer color filter array pattern showing a minimal repeating unit and a non-minimal repeating unit.
FIG. 3 provides representative spectral quantum efficiency curves for red, green, and blue pixels, as well as a wider spectrum panchromatic quantum efficiency, all multiplied by the transmission characteristics of an infrared cut filter.

In order to produce a color image, the array of pixels in an image sensor typically has a pattern of color filters placed over them. FIG. 2 shows a pattern of red, green, and blue color filters that is commonly used. This particular pattern is commonly known as a Bayer color filter array (CFA) after its inventor Bryce Bayer as disclosed in U.S. Pat. No. 3,971,065. This pattern is effectively used in image sensors having a two-dimensional array of color pixels. As a result, each pixel has a particular color photoresponse that, in this case, is a predominant sensitivity to red, green or blue light. Another useful variety of color photoresponses is a predominant sensitivity to magenta, yellow, or cyan light. In each case, the particular color photoresponse has high sensitivity to certain portions of the visible spectrum, while simultaneously having low sensitivity to other portions of the visible spectrum. The term color pixel will refer to a pixel having a color photoresponse.

The set of color photoresponses selected for use in a sensor usually has three colors, as shown in the Bayer CFA, but it can also include four or more. As used herein, a panchromatic photoresponse refers to a photoresponse having a wider spectral sensitivity than those spectral sensitivities represented in the selected set of color photoresponses. A panchromatic photosensitivity can have high sensitivity across the entire visible spectrum. The term panchromatic pixel will refer to a pixel having a panchromatic photoresponse. Although the panchromatic pixels generally have a wider spectral sensitivity than the set of color photoresponses, each panchromatic pixel can have an associated filter. Such filter is either a neutral density filter or a color filter.

Electronic image sensors with several groups of color pixels capture color images with a specific set of spectral sensitivities, a specific tone scale (usually linear), and signal to noise characteristics resulting from the design of such a sensor. The raw image data from the sensor must be corrected in various ways to provide an image suitable for viewing. As used herein, Correction includes white balancing, color processing to convert from sensor primaries to the desired output primaries, tone scale and gamma correction, and also spatial processing, such as interpolation, noise reduction and sharpening.

When a pattern of color and panchromatic pixels is on the face of an image sensor, each such pattern has a repeating unit that is a contiguous subarray of pixels that acts as a basic building block. By juxtaposing multiple copies of the repeating unit, the entire sensor pattern is produced. The juxtaposition of the multiple copies of repeating units are done in diagonal directions as well as in the horizontal and vertical directions.

A minimal repeating unit is a repeating unit such that no other repeating unit has fewer pixels. For example, the CFA in FIG. 2 includes a minimal repeating unit that is two pixels by two pixels as shown by pixel block 100 in FIG. 2. Multiple copies of this minimal repeating unit is tiled to cover the entire array of pixels in an image sensor. The minimal repeating unit is shown with a green pixel in the upper right corner, but three alternative minimal repeating units can easily be discerned by moving the heavy outlined area one pixel to the right, one pixel down, or one pixel diagonally to the right and down. Although pixel block 102 is a repeating unit, it is not a minimal repeating unit because pixel block 100 is a repeating unit and pixel block 100 has fewer pixels than pixel block 102.

An image captured using an image sensor having a two-dimensional array with the CFA of FIG. 2 has only one color value at each pixel. In order to produce a full color image, there are a number of techniques for inferring or interpolating the missing colors at each pixel. These CFA interpolation techniques are well known in the art and reference is made to the following U.S. Pat. Nos. 5,506,619; 5,629,734, and 5,652,621.

FIG. 3 shows the relative spectral sensitivities of the pixels with red, green, and blue color filters in a typical camera application. The X-axis in FIG. 3 represents light wavelength in nanometers, and the Y-axis represents efficiency. In FIG. 3, curve 110 represents the spectral transmission characteristic of a typical filter used to block infrared and ultraviolet light from reaching the image sensor. Such a filter is needed because the color filters used for image sensors typically do not block infrared light, hence the pixels are unable to distinguish between infrared light and light that is within the passbands of their associated color filters. The infrared blocking characteristic shown by curve 110 prevents infrared light from corrupting the visible light signal. The spectral quantum efficiency, i.e. the proportion of incident photons that are captured and converted into a measurable electrical signal, for a typical silicon sensor with red, green, and blue filters applied is multiplied by the spectral transmission characteristic of the infrared blocking filter represented by curve 110 to produce the combined system quantum efficiencies represented by curve 114 for red, curve 116 for green, and curve 118 for blue. It is understood from these curves that each color photoresponse is sensitive to only a portion of the visible spectrum. By contrast, the photoresponse of the same silicon sensor that does not have color filters applied (but including the infrared blocking filter characteristic) is shown by curve 112; this is an example of a panchromatic photoresponse. By comparing the color photoresponse curves 114, 116, and 118 to the panchromatic photoresponse curve 112, it is clear that the panchromatic photoresponse is three to four times more sensitive to wide spectrum light than any of the color photoresponses.

The greater panchromatic sensitivity shown in FIG. 3 permits improving the overall sensitivity of an image sensor by intermixing pixels that include color filters with pixels that do not include color filters. However, the color filter pixels will be significantly less sensitive than the panchromatic pixels. In this situation, if the panchromatic pixels are properly exposed to light such that the range of light intensities from a scene cover the full measurement range of the panchromatic pixels, then the color pixels will be significantly underexposed. Hence, it is advantageous to adjust the sensitivity of the color filter pixels so that they have roughly the same sensitivity as the panchromatic pixels. The sensitivity of the color pixels are increased, for example, by increasing the size of the color pixels relative to the panchromatic pixels, with an associated reduction in spatial pixels.

Figures 4A, 4B, 4C, 4D, 5:
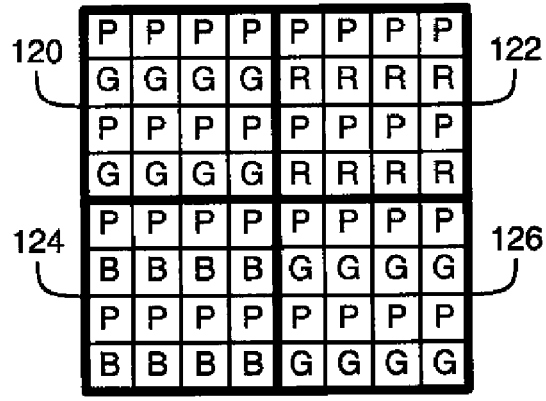
FIGS. 4A-D provides minimal repeating units for several variations of a color filter array pattern of the present invention that has color pixels with the same color photo response arranged in rows or columns.
FIG. 5 shows the cell structure of the minimal repeating unit from FIG. 4A.

FIG. 4A represents a two-dimensional array of pixels having two groups. Pixels from the first group of pixels have a narrower spectral photoresponse than pixels from the second group of pixels. The first group of pixels includes individual pixels that relate to at least two different spectral photoresponses corresponding to at least two color filters. These two groups of pixels are intermixed to improve the overall sensitivity of the sensor. As will become clearer in this specification, the placement of the first and second groups of pixels defines a pattern that has a minimal repeating unit including at least twelve pixels. The minimal repeating unit includes first and second groups of pixels arranged to permit the reproduction of a captured color image under different lighting conditions.

The complete pattern shown in FIG. 4A represents a minimal repeating unit that is tiled to cover an entire array of pixels. As with FIG. 2, there are several other minimal repeating units that are used to describe this overall arrangement of color and panchromatic pixels, but they are all essentially equivalent in their characteristics and each is a subarray of pixels, the subarray being eight pixels by eight pixels in extent. An important feature of this pattern is alternating rows of panchromatic and color pixels with the color rows having pixels with the same color photoresponse grouped together. The groups of pixels with the same photoresponse along with some of their neighboring panchromatic pixels are considered to form four cells that make up the minimal repeating unit, a cell being a contiguous subarray of pixels having fewer pixels than a minimal repeating unit.

These four cells, delineated by heavy lines in FIG. 4A and shown as cells 120, 122, 124, and 126 in FIG. 5, enclose four groups of four-by-four pixels each, with 120 representing the upper left cell, 122 representing the upper right cell, 124 representing the lower left cell, and 126 representing the lower right cell. Each of the four cells includes eight panchromatic pixels and eight color pixels of the same color photoresponse. The color pixels in a cell are combined to represent the color for that entire cell. Hence, cell 120 in FIG. 5 is considered to be a green cell, cell 122 is considered to be a red cell, and so on. Each cell includes at least two pixels of the same color, thereby allowing pixels of the same color to be combined to overcome the difference in photosensitivity between the color pixels and the panchromatic pixels.

In the case of a minimal repeating unit with four non-overlapping cells, with each cell having two pixels of the same color and two panchromatic pixels, it is clear that the minimal repeating unit includes sixteen pixels. In the case of a minimal repeating unit with three non-overlapping cells, with each cell having two pixels of the same color and two panchromatic pixels, it is clear that the minimal repeating unit includes twelve pixels.

Figures 6A, 6B, 7A, 7B, 7C:
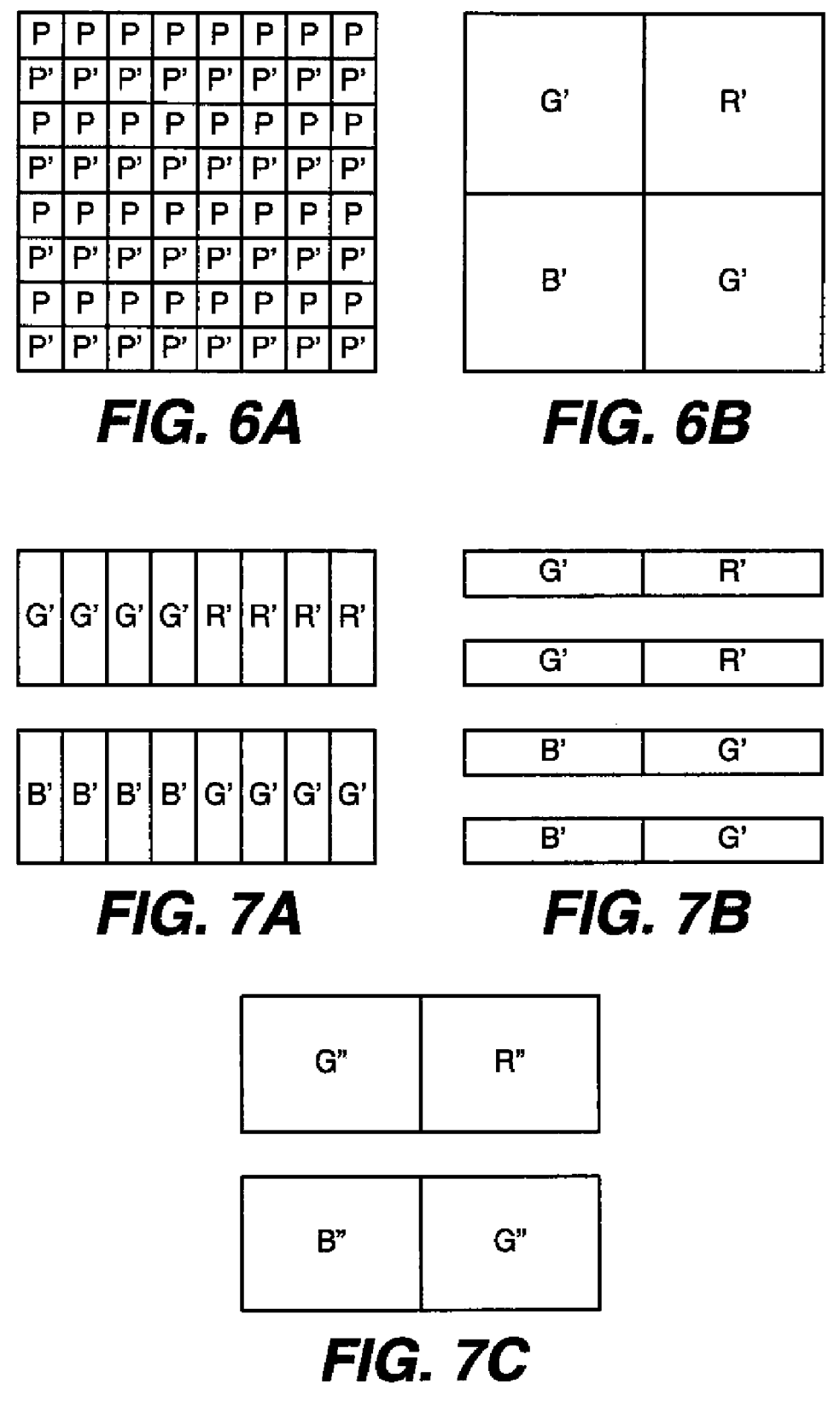

In accordance with the present invention, the minimal repeating unit of FIG. 4A, when considered in light of the cell structure identified in FIG. 5, can represent the combination of a high-resolution panchromatic image and a low-resolution Bayer pattern color image arranged to permit the reproduction of a captured color image under different lighting conditions. The individual elements of the Bayer pattern image represent the combination of the color pixels in the corresponding cells. The first group of pixels defines a low-resolution color filter array image and the second group of pixels defines a high-resolution panchromatic image. See FIG. 6A and FIG. 6B. FIG. 6A represents the high-resolution panchromatic image corresponding to FIG. 4A, including both the panchromatic pixels P from FIG. 4A as well as interpolated panchromatic pixels P'; and FIG. 6B represents the low-resolution Bayer pattern color image, with R', G', and B' representing for each of the cells outlined in FIG. 5 the cell color associated with the combined color pixels in the cell.

In the following discussion, all cells in FIGS. 4B-D are delineated by heavy lines, as they were in FIG. 4A.

In addition to alternative minimal repeating units of FIG. 4A, each cell of the pattern is rotated 90 degrees to produce the pattern shown in FIG. 4B. This is substantially the same pattern, but it places the highest panchromatic sampling frequency in the vertical direction instead of the horizontal direction. The choice to use FIG. 4A or FIG. 4B depends on whether or not it is desired to have higher panchromatic spatial sampling in either the horizontal or vertical directions respectively. However, it is clear that the resulting cells that make up the minimal repeating unit in both patterns produce the same low-resolution color image for both patterns. Hence, FIG. 4A and FIG. 4B are equivalent from a color perspective. In general, FIG. 4A and FIG. 4B are examples of practicing the present invention with the panchromatic pixels arranged linearly in either rows or columns. Furthermore, FIG. 4A has single rows of panchromatic pixels with each row separated from a neighboring row of panchromatic pixels by a row of color pixels; FIG. 4B has the same characteristic in the column direction.

FIG. 4C represents yet another alternative minimal repeating unit to FIG. 4A with essentially the same cell color characteristics. However, FIG. 4C shows the panchromatic and color rows staggered on a cell by cell basis. This can improve the vertical panchromatic resolution. Yet another alternative minimal repeating unit to FIG. 4A is represented in FIG. 4D, wherein the panchromatic and color rows are staggered by column pairs. This also has the potential of improving the vertical panchromatic resolution. A characteristic of all of the minimal repeating units of FIGS. 4A-D is that groups of two or more same color pixels are arranged side by side in either rows or columns.

FIGS. 4A-D all have the same color structure with the cells that constitute the minimal repeating unit expressing a low-resolution Bayer pattern. It can therefore be seen that a variety of arrangements of panchromatic pixels and grouped color pixels are constructed within the spirit of the present invention.

In order to increase the color photosensitivity to overcome the disparity between the panchromatic photosensitivity and the color photosensitivity, the color pixels within each cell is combined in various ways. For example, the charge from same colored pixels are combined or binned in a CCD image sensor or in types of active pixel sensors that permit binning. Alternatively, the voltages corresponding to the measured amounts of charge in same colored pixels are averaged, for example by connecting in parallel capacitors that are charged to these voltages. In yet another approach, the digital representations of the light levels at same colored pixels are summed or averaged. Combining or binning charge from two pixels doubles the signal level, while the noise associated with sampling and reading out the combined signal remains the same, thereby increasing the signal to noise ratio by a factor of two, representing a corresponding two times increase in the photosensitivity of the combined pixels. In the case of summing the digital representations of the light levels from two pixels, the resulting signal increases by a factor of two, but the corresponding noise levels from reading the two pixels combine in quadrature, thereby increasing the noise by the square root of two; the resulting signal to noise ratio of the combined pixels therefore increases by the square root of two over the uncombined signals. A similar analysis applies to voltage or digital averaging.

In describing the present invention, the term combining means any mechanism for using signals from multiple pixels to produce one output pixel. For example, both pixels may be read out of the sensor and the digital representations of the signal levels are summed or averaged digitally. Another example is the use of binning in CCD image sensors that permit binning. Binning is a technique specific to CCD image sensors that combines the charge from multiple pixels into one packet of charge before conversion of the charge to a voltage. In a third example, the voltages corresponding to the measured amounts of charge are averaged, for example by connecting in parallel capacitors that are charged to these voltages.

The previously mentioned approaches for combining signals from same colored pixels within a cell are used singly or in combinations. For example, by vertically combining the charge from same colored pixels in FIG. 4A in groups of two to produce the combined pixels with combined signals R', G', and B' shown in FIG. 7A. In this case, each R', G', and B' has twice the sensitivity of the uncombined pixels. Alternatively, horizontally combining the measured values, (either voltage or digital) from same colored pixels in FIG. 4A in groups of four produces the combined pixels with combined signals R', G', and B' shown in FIG. 7B. In this case, since the signal increases by a factor of four but the noise increases by 2, each R', G', and B' has twice the sensitivity of the uncombined pixels. In another alternative combination scheme, vertically combining the charge from same colored pixels in groups of two as in FIG. 7A, and horizontally summing or averaging the measured values of the combined pixels of FIG. 7A in groups of four produces the final combined color pixels of FIG. 7C, with R", G", and B" representing the final combinations of same colored pixels. In this combination arrangement, the final combined color pixels of FIG. 7C each have four times the sensitivity of the uncombined pixels. Some sensor architectures, notably certain CCD arrangements, can permit the charge from all eight same colored pixels within each cell to be combined in the fashion of FIG. 7C, leading to an eightfold increase in sensitivity for the combined color pixels.

From the foregoing, it will now be understood that there are several degrees of freedom in combining color pixels for the purpose of adjusting the photosensitivity of the color pixels. Well known combining schemes will suggest themselves to one skilled in the art and is based on scene content, scene illuminant, overall light level, or other criteria. Furthermore, the combining scheme is selected to deliberately permit the combined pixels to have either less sensitivity or more sensitivity than the panchromatic pixels.

Figures 8A, 8B, 8C, 8D, 8E, 9A, 9B, 9C:
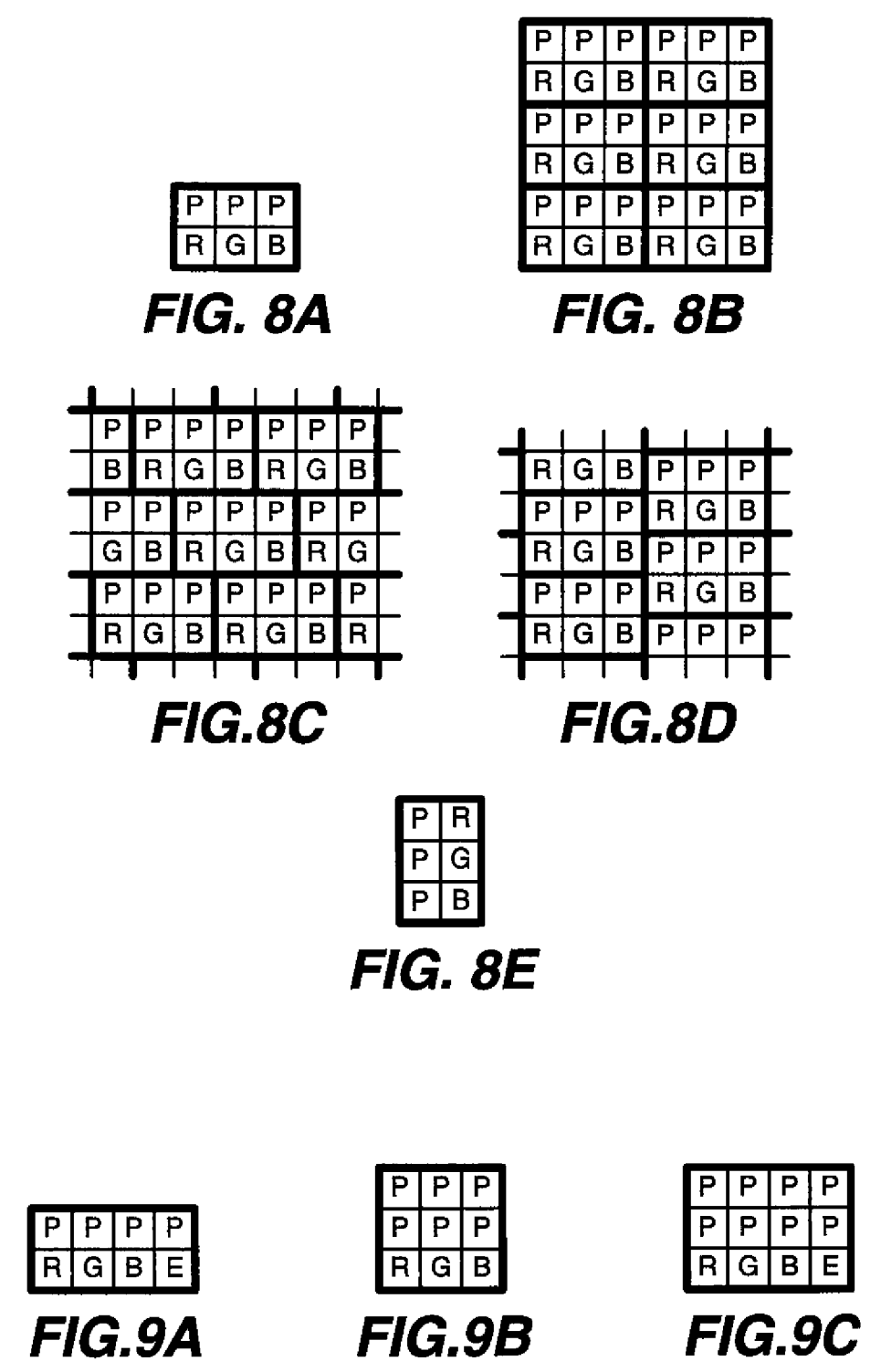

To this point the image sensor has been described as employing red, green, and blue filters such that there are two green pixels for every red and blue pixel. The present invention is also practiced with red, green, and blue filters in equal proportions as shown in FIG. 8A. The minimal repeating unit of FIG. 8A can be used to tile the sensor array in several different ways, some of which are shown in FIGS. 8B-D. It will be understood that geometrically similar variations of these patterns, such as the minimal repeating unit of FIG. 8A, can be used. FIG. 8E shows a rotated form of the minimal repeating unit of FIG. 8A.

The present invention is also usable with pixels having more than three color photoresponses. FIG. 9A shows a variation of minimal repeating of FIG. 8A that uses four colors in addition to the panchromatic pixels. FIGS. 9B-C show additional variations of both of these patterns in which the single row of panchromatic pixels is replaced by a double row of panchromatic pixels. All of these patterns do not have a plurality of pixels of the same color. This fact and the preferred method for using such patterns will be discussed later.

Figures 10A, 10B, 10C, 10D, 10E, 10F, 11A, 11B:
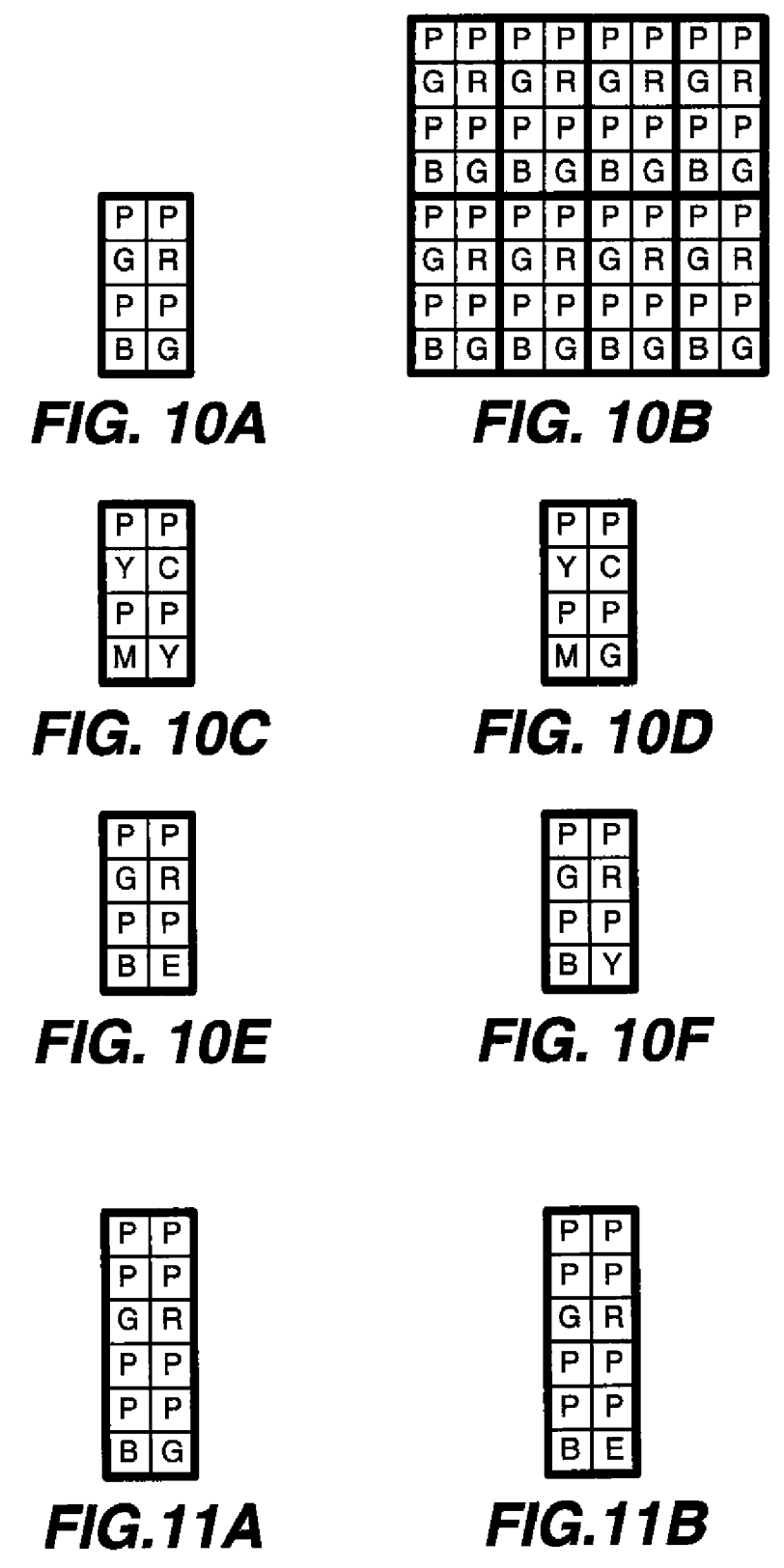

Another minimal repeating unit is shown in FIG. 10A that contains one red, two green, and one blue pixels. A tiling example, using this pattern, is shown in FIG. 10B.

Image sensors employing cyan, magenta, and yellow sensors are well known in the art, and the present invention is practiced with cyan, magenta, and yellow color filters. FIG. 10C shows the cyan, magenta, and yellow equivalent of FIG. 10A, with C representing cyan pixels, M representing magenta pixels, and Y representing yellow pixels.

FIG. 10D shows a minimal repeating unit of the present invention that includes cyan pixels (represented by C), magenta pixels (represented by M), yellow pixels (represented by Y), and green pixels (represented by G). FIG. 10E shows yet another alternative four color arrangement including red pixels (represented by R), blue pixels (represented by B), green pixels with one color photoresponse (represented by G), and alternative green pixels with a different color photoresponse (represented by E). FIG. 10F shows yet another alternative four color arrangement, wherein one of the green cells of FIG. 10A is replaced by a yellow cell, with the yellow pixels represented by Y.

FIG. 11A shows a variation of the pattern of FIG. 10A in which each row of panchromatic pixels is replaced by a double row of panchromatic pixels. An additional example, shown in FIG. 11B, is the same variation applied to the pattern of FIG. 10E.

Figure 12A:
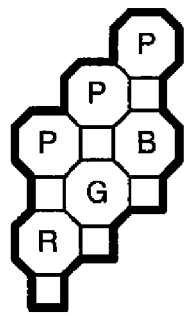
FIGS. 12A-B provides a minimal repeating unit and for a color filter array of the present invention in which the pixels are on a rectangular grid that is rotated forty-five degrees, and includes a tiling arrangement.
Figure 12B:
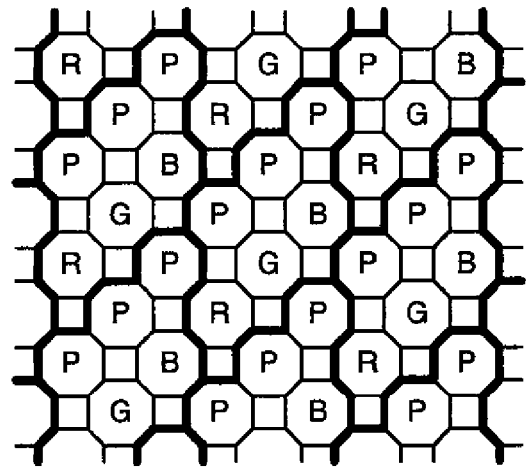

The present invention is practiced with pixels arrays other than a rectangular array. FIG. 12A shows a variation of the pattern of FIG. 8A in which the pixels are octagonal and are arranged on a diagonal row. Because the pixel geometry is octagonal, there are small square vacancies located between horizontal and vertical neighbors that can be used for required sensor functionality such as data transfer circuitry. FIG. 12B shows an example of a tiling pattern using the minimal repeating unit of FIG. 12A. In FIG. 12B the panchromatic pixels appear in rows that are diagonal in nature. Likewise, the color pixels also appear in diagonally oriented rows.

Figure 13A:
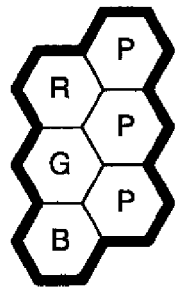
FIGS. 13A-B provides a minimal repeating unit and for a color filter array of the present invention in which the pixels are arranged in a hexagonal pattern, and includes a tiling arrangement.
Figure 13B:
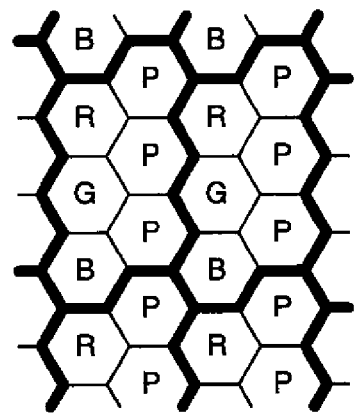

FIG. 13A shows another variation of the pattern of FIG. 8A in which the pixels are hexagonal and arranged vertically. FIG. 13B shows an example of a tiling pattern using the minimal repeating unit of FIG. 13A. In FIG. 13B the panchromatic pixels appear in columns. Likewise, the color pixels also appear in columns.

Figure 14:
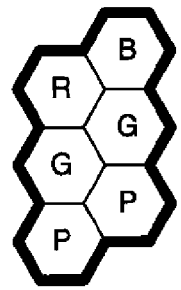
FIG. 14 provides a minimal repeating unit for a color filter array of the present invention that is an alternative to FIG. 13.
Figure 15:
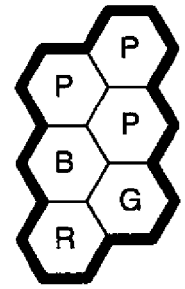
FIG. 15 provides a minimal repeating unit for a color filter array of the present invention that is an alternative to FIG. 13.

FIG. 14 shows another minimal repeating unit using fewer panchromatic pixels than color pixels wherein the pixels are hexagonally packed and wherein the panchromatic pixels appear in rows that are diagonal in nature. Also, in FIG. 14, the color pixels appear in diagonally oriented rows. FIG. 15 shows another variation of the pattern of FIG. 13A. Within the scope of the present invention, it should be noted that rows and columns of pixels are not necessarily perpendicular to each other as is shown in FIGS. 12A-15.

Figures 16, 17A, 17B, 17C, 17D, 17E:
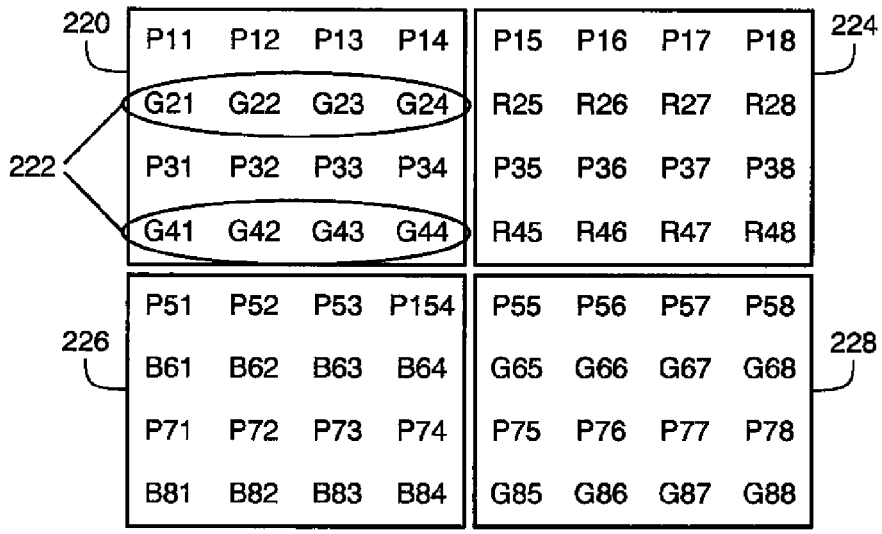
FIG. 16 is the minimal repeating unit of FIG. 4A with subscripts for individual pixels within the minimal repeating unit.
FIGS. 17A-E shows the panchromatic pixels and the color pixels of one cell of FIG. 16, and various ways in which the color pixels are combined.

Turning now to FIG. 16, the minimal repeating unit of FIG. 5 is shown subdivided into four cells, a cell being a contiguous subarray of pixels having fewer pixels than a minimal repeating unit. The software needed to provide the following processing is included in DSP 36 of FIG. 1. Cells 220, 224, 226, and 228 are examples of cells wherein these cells contain pixels having green, red, blue and green photoresponses, respectively. In this example, cell 220 contains both panchromatic pixels and green pixels, the green pixels being identified as pixel group 222. The eventual goal is to produce a single green signal for cell 220 by combining the eight green signals from the green pixels in pixel group 222. Depending on the image sensor's mode of operation, a single green signal is produced by combining all eight green signals in the analog domain (e.g. by charge binning), or multiple green signals are produce by combining smaller groups of pixels taken from pixel group 222. The panchromatic pixels of cell 220 are shown in FIG. 17A. In the following examples, all eight signals from these panchromatic pixels are individually digitized. The green pixels of cell 220 are shown in FIGS. 17B-17E wherein they are grouped together according to how their signals are combined in the analog domain. FIG. 17B depicts the case in which all eight green pixels are combined to produce a single green signal for cell 220 (FIG. 16). The sensor can produce two green signals, for example, by first combining the signals from pixels G21, G22, G23, and G24, and then combining the signals from pixels G41, G42, G43, and G44, as shown in FIG. 17C. Two signals are produced in other ways as well. The sensor can first combine signals from pixels G21, G22, G41, and G42, and then combine signals from pixels G23, G24, G43, and G44, as shown in FIG. 17D. The sensor can also produce four green signals for cell 220 by combining four pairs of signals, for example, combining pixels G21 with G22, then combining G23 with G24, then combining G41 with G42, and finally combining G43 with G44, as shown in FIG. 17E. It is clear that there are many additional ways to combine pairs of green signals within cell 220 (FIG. 16). If the sensor does no combining at all, then all eight green signals are reported individually for cell 220. Thus, in the case of cell 220, the sensor can produce one, two, four or eight green values for cell 220, and produce them in different ways, depending on its mode of operation.

For cells 224, 226, and 228 (FIG. 16), similar color signals are produced by the sensor depending on its mode of operation. The color signals for cells 224, 226, and 228 are red, blue, and green, respectively.

Returning to the case of cell 220, regardless of how many signals are digitized for this cell, the image processing algorithm of the present invention further combines the digitized green values to produce a single green value for the cell. One way that a single green value is obtained is by averaging all the digitized green values produced for cell 220. In the event that a cell contains color pixels of differing photoresponses, all the color data within the cell is similarly combined so that there is a single value for each color photoresponse represented within the cell.

It is important to distinguish between the color values pertaining to pixels in the original sensor that captured the raw image data, and color values pertaining to cells within the original sensor. Both types of color values are used to produce color images, but the resulting color images are of different resolution. An image having pixel values associated with pixels in the original sensor is referred to as a high-resolution image, and an image having pixel values associated with cells within the original sensor is referred to as a low-resolution image.

Figure 18:
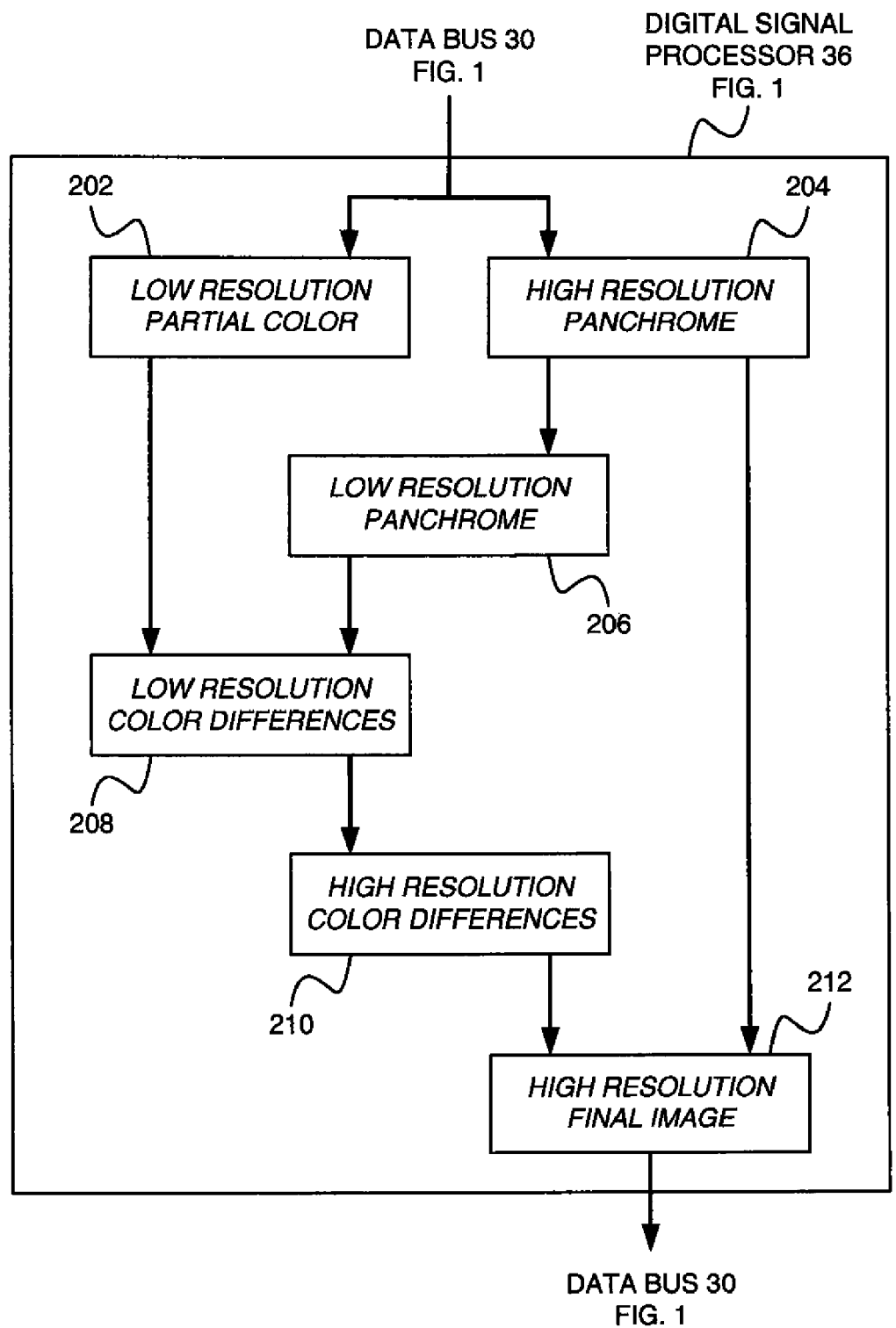
FIG. 18 is a process diagram of the present invention showing the method of processing the color and panchromatic pixel data from a sensor of the present invention.

Turning now to FIG. 18, the digital signal processor block 36 (FIG. 1) is shown receiving captured raw image data from the data bus 30 (FIG. 1). The raw image data is passed to both a Low-resolution Partial Color block 202 and a High-resolution Panchrome block 204. An example of a minimal repeating unit for an image sensor has already been shown in FIG. 5 and FIG. 16. In the case of cell 220 (FIG. 16), the captured raw image data includes the panchromatic data that is produced by the individual panchromatic pixels as shown in FIG. 17A. Also, for cell 220 (FIG. 16), one or more green (color) values are also included, for example, from the combinations shown in FIGS. 17B-E.

In the Low-resolution Partial Color block 202 (FIG. 18), a partial color image is produced from the captured raw image data, a partial color image being a color image wherein each pixel has at least one color value and each pixel is also missing at least one color value. Depending on the image sensor's mode of operation, the captured raw data contains some number of color values produced by the color pixels within each cell. Within the Low-resolution Partial Color block 202, these color values are reduced to a single value for each color represented within the cell. For the cell 220 (FIG. 16), as an example, a single green color value is produced. Likewise, for cells 224, 226 and 228, a single red, blue and green color value is produced, respectively.

The Low-resolution Partial Color block 202 processes each cell in a similar manner resulting in an array of color values, one for each cell. Because the resulting image array based on cells rather than pixels in the original sensor, it is four times smaller in each dimension than the original captured raw image data array. Because the resulting array is based on cells and because each pixel has some but not all color values, the resulting image is a low-resolution partial color image. At this point, the low-resolution partial color image is color balanced.

Looking now at the High-resolution Panchrome block 204, the same raw image data is used as shown in FIG. 16, although only the panchromatic values will be used (FIG. 17A). This time the task is to interpolate a complete high-resolution panchromatic image by estimating panchromatic values at those pixels not having panchromatic values already. In the case of cell 220 (FIG. 16), panchromatic values must be estimated for the green pixels in pixel group 222 (FIG. 16). One simple way to estimate the missing panchromatic values is to do vertical averaging. Thus, for example, we can estimate the panchromatic value at pixel 22 as follows:

$P22=(P12+P32)/2$

An adaptive method can also be used. For example, one adaptive method is to compute three gradient values and take their absolute values:

$SCLAS=ABS(P31-P13)$ $VCLAS=ABS(P32-P12)$ $BCLAS=ABS(P33-P11)$ using the panchromatic values are shown in FIG. 17A. Likewise, three predictor values are computed:

$SPRED=(P31+P13)/2$ $VPRED=(P32+P12)/2$ $BPRED=(P33+P11)/2$

Then, set P22 equal to the predictor corresponding to the smallest classifier value. In the case of a tie, set P22 equal to the average the indicated predictors. The panchromatic interpolation is continued throughout the image without regard to cell boundaries. When the processing of High-resolution Panchrome block 204 is done, the resulting digital panchromatic image is the same size as the original captured raw image, which makes it a high-resolution panchromatic image.

A Low-resolution Panchrome block 206 receives the high-resolution panchromatic image array produced by High-resolution Panchrome block 204 and generates a low-resolution panchromatic image array which is the same size as the low-resolution partial color image produced by Low-resolution Partial Color block 202. Each low-resolution panchromatic value is obtained by averaging the estimated panchromatic values, within a given cell, for those pixels having color filters. In the case of cell 220 (FIG. 16) the high-resolution panchromatic values, previously estimated for the green pixels in pixel group 222 (FIG. 16), are now averaged together to produce a single low-resolution panchromatic value for the cell. Likewise, a single low-resolution panchromatic value is computed for cell 224 using high-resolution panchromatic values estimated at the pixels having red filters. In this manner, each cell ends up with a single low-resolution panchromatic value.

A Low-resolution Color Difference block 208 receives the low-resolution partial color image from Low-resolution Partial Color block 202 and the low-resolution panchrome array from Low-resolution Panchrome block 206. A low-resolution intermediate color image is then formed by color interpolating the low-resolution partial color image with guidance from the low-resolution panchrome image. The exact nature of the color interpolation algorithm, to be discussed in detail later, depends on which pattern of pixel photoresponses was used to capture the original raw image data.

After the low-resolution intermediate color image is formed it is color corrected. Once the low-resolution intermediate color image is color corrected, a low-resolution image of color differences are computed by subtracting the low-resolution panchromatic image from each of the low-resolution color planes individually. A High-resolution Color Difference block 210 receives the low-resolution color difference image from Low-resolution Color Difference block 208 and, using bilinear interpolation, upsamples the low-resolution color difference image to match the size of the original raw image data. The result is a high-resolution color difference image that is the same size as the high-resolution panchromatic image produced by High-resolution Panchrome block 204.

A High-resolution Final Image block 212 receives the high-resolution color difference image from High-resolution color differences block 210 and the high-resolution panchromatic image from High-resolution Panchrome block 204. A high-resolution final color image is then formed by adding the high-resolution panchromatic image to each of the high-resolution color difference planes. The resulting high-resolution final color image can then be further processed. For example, it is stored in the DSP Memory block 32 (FIG. 1) and then sharpened and compressed for storage on the Memory Card block 64 (FIG. 1).

The sensor filter patterns shown in FIGS. 4A-D have a minimal repeating unit such that the resulting low-resolution partial color image, produced in Low-resolution partial color block 202, exhibits the repeating Bayer pattern for color filters:

G R
B G

In addition to a single color value, given by the low-resolution partial color image, every cell also has a panchromatic value given by the low-resolution panchromatic image.

Considering the case in which the Bayer pattern is present in the low-resolution partial color image, the task of color interpolation within the Low-resolution Color Differences block 208 (FIG. 18) can now be described in greater detail. Color interpolation begins by interpolating the green values at pixels not already having green values, shown as pixel 234 in FIG. 19A. The four neighboring pixels, shown as pixels 230, 232, 236, and 238, all have green values and they also all have panchromatic values. The center pixel 234 has a panchromatic value, but does not have a green value as indicated by the question marks.

The first step is to compute two classifier values, the first relating to the horizontal direction, and the second to the vertical direction:

$$HCLAS = ABS(P4-P2) + ABS(2*P3-P2-P4)$$

$$VCLAS = ABS(P5-P1) + ABS(2*P3-P1-P5)$$

Then, compute two predictor values, the first relating to the horizontal direction, and the second to the vertical direction:

$$HPRED = (G4+G2)/2 + (2*P3-P2-P4)/2$$

$$VPRED = (G5+G1)/2 + (2*P3-P1-P5)/2$$

Finally, letting THRESH be an empirically determined threshold value, we can adaptively compute the missing value, G3, according to:

```
IF MAX( HCLAS, VCLAS ) < THRESH
    G3  = ( HPRED + VPRED )/2
ELSEIF VCLAS < HCLAS
    G3  = VPRED
ELSE
    G3  = HPRED
END
```

Thus, if both classifiers are smaller than the threshold value, an average of both predictor values is computed for G3. If not, then either HPRED or VPRED is used depending on which classifier HCLAS or VCLAS is smaller.

Figure 19A:
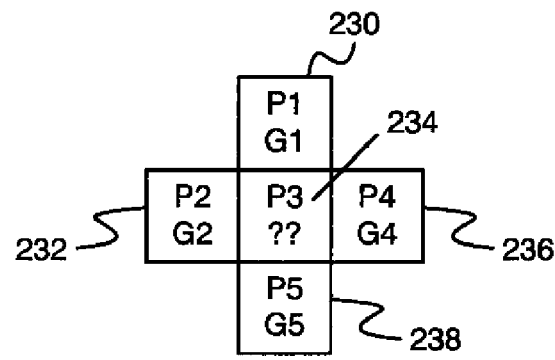
FIGS. 19A-D illustrates methods of the present invention for interpolating missing colors in the low-resolution partial color image of FIG. 18.
Figure 19B:
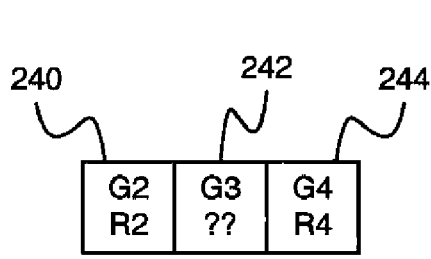

Once all the missing green values have been estimated, the missing red and blue values are interpolated. As shown in FIG. 19B, pixel 242 is missing a red value but its two horizontal neighbors, pixels 240 and 244, have red values R2 and R4 respectively. All three pixels have green values. Under these conditions, an estimate for the red value (R3) for pixel 242 is computed as follows:

$$R3 = (R4+R2)/2 + (2*G3-G2-G4)/2$$

Figure 19C:
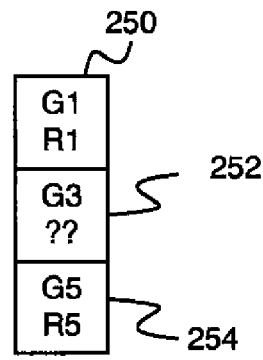

Missing blue values are computed in a similar way under similar conditions. At this point, the only pixels that still have missing red and blue values are those requiring vertical interpolation. As shown in FIG. 19C, pixel 252 is missing a red value and its two vertical neighbors, pixels 250 and 254, have red values R1 and R5 respectively. Under these conditions, an estimate for the red value (R3) for pixel 252 is computed as follows:

$$R3 = (R5+R1)/2 + (2*G3-G1-G5)/2$$

Missing blue values are computed in a similar way under similar conditions. This completes the interpolation of the low-resolution partial color image and the result is a low-resolution intermediate color image. As described earlier, the low-resolution color differences can now be computed by subtracting the low-resolution panchrome values from each color plane: red, green, and blue in the example just discussed.

Figure 20:
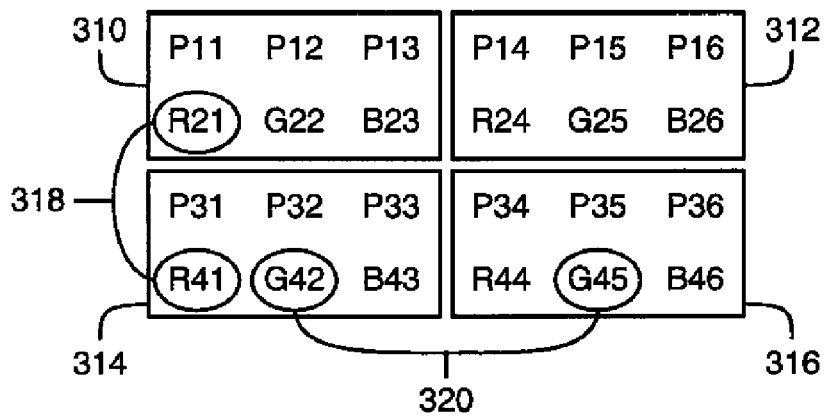
FIG. 20 provides two of the minimal repeating units of FIG. 8A showing combining pixels between adjacent minimal repeating units.

Turning now to FIG. 20, a partial tiling of a sensor is shown using four copies of the minimum repeating unit of FIG. 8A. Four adjacent minimal repeating units 310, 312, 314, and 316 each contain a red, green, and blue pixel. Although the earlier discussion of combining pixels was limited to like colored pixels within the same minimum repeating unit, as shown in FIG. 16 for example, the present invention can also be practiced by combining pixels from nearby minimal repeating units. As shown in FIG. 20, the red pixels R21 and R41 constitute a pair of pixels 318 that are combined in a vertical direction. Likewise, the green pixels G42 and G45 constitute a pair of pixels 320 that are combined in a horizontal direction. When the minimal repeating is relatively small, such as the pattern of FIG. 8A as used in FIG. 20, it is useful to combine like colored pixels from adjacent minimal repeating units. The process of combining pixels has been discussed above and can be used on an image sensor shown in FIG. 20 and FIG. 21.

Figure 21:
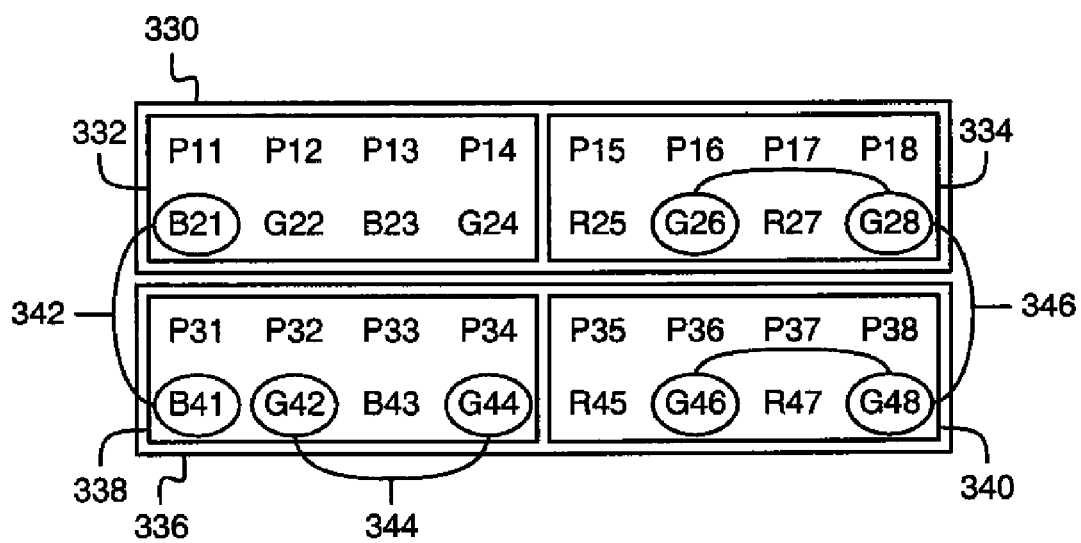
FIG. 21 provides two minimal repeating units for an alternative color filter array of the present invention showing combining pixels between adjacent minimal repeating units as well as within the cells of the minimal repeating units.

Turning now to FIG. 21, a minimal repeating unit having 16 pixels is shown having two copies. The top minimal repeating unit 330 is subdivided into two cells 332 and 334. Cell 332 contains a horizontal row of four panchromatic pixels P11, P12, P13, and P14, two blue pixels B21 and B23, and two green pixels G22 and G24. Cell 334 contains a horizontal row of four panchromatic pixels P15, P16, P17, and P118, two red pixels R25 and R27 and two green pixels G26 and G28. A bottom minimal repeating unit 336 is subdivided into two cells 338 and 340 that contain the same pattern of pixels as cells 332 and 334, respectively. As shown in FIG. 21, the blue pixels B21 and B41 constitute a pair of pixels 342 that are taken from adjacent minimal repeating units 332 and 336 and that are combined in the vertical direction. Likewise, the green pixels G42 and G44 constitute a pair of pixels 344 that are taken from the same minimal repeating unit 336 and that are combined in a horizontal direction.

While combining pairs of pixels is useful, the present invention includes combining an arbitrary number of pixels, both within a single minimal repeating unit and among a plurality of adjacent minimal repeating units. As shown in FIG. 21, the green pixels G26, G28, G46, and G48 constitute a four-tuple of pixels 346 all of which are combined to produce a single color value. This four-fold combination simultaneously includes combining pixels horizontally and vertically, as well as combining a plurality of pixels from within a single minimal repeating units, and pixels taken from a plurality of adjacent minimal repeating units.

All of the examples show like colored pixels combined, but panchromatic pixels can also be combined to produce panchromatic values having twice the photographic speed. In addition, color pixels can be combined with panchromatic pixels to provide color information under extremely low light conditions. The patterns for such combinations are very similar to those examples already shown.

Figure 19D:
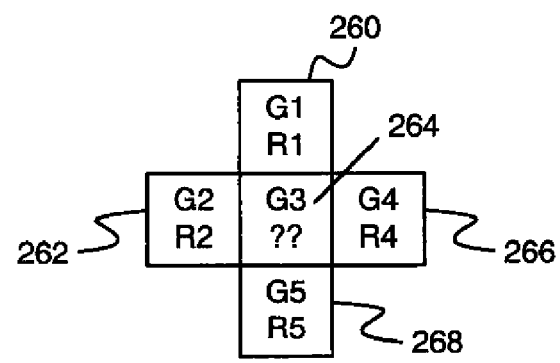

Not all sensors produce low-resolution partial color images exhibiting a repeating Bayer pattern of color values. For example, the sensor pattern shown in FIG. 21 determines that two adjacent minimal repeating units generate two pairs of color values. In each case, a pair of cells from adjacent minimal repeating units produces color values for a low resolution color representation of the image. The pair of cells 332 and 338 generates a blue and a green color value by combining pixels B21, B23, B41, and B43 for the blue value and by combining pixels G22, G24, G42, and G44 for the green value. Likewise, the pair of cells 334 and 340 generates a red and a green color value by combining pixels R25, R27, R45, and R47 for the red value and by combining pixels G26, G28, G46, and G48 for the green value. This pattern of combining pixels between cells from adjacent minimal repeating units is repeated over the entire sensor. The result is a low resolution representation of the image wherein each low resolution pixel has a green color value and either a red or a blue color value. At this point, the color interpolation task within the Low-resolution Color Differences block 208 (FIG. 18) estimates missing values of red or missing values of blue for each pixel. Referring to FIG. 19D, a pixel 264 is shown having a green value (G3) but not having a red value (R3). Four of the neighboring pixels 260, 262, 266, and 268 have green values and red values. The method for interpolating the red value for pixel 264 (FIG. 19D) is similar to the method used to interpolate the green value for pixel 234 (FIG. 19A).

The first step is to compute two classifier values, the first relating to the horizontal direction, and the second to the vertical direction:

$HCLAS=ABS(G4-G2)+ABS(2*G3-G2-G4)$ $VCLAS=ABS(G5-G1)+ABS(2*G3-G1-G5)$

Then, compute two predictor values, the first relating to the horizontal direction, and the second to the vertical direction:

$HPRED=(R4+R2)/2+(2*G3-G2-G4)/2$ $VPRED=(R5+R1)/2+(2*G3-G1-G5)/2$

Finally, letting THRESH be an empirically determined threshold value, the missing value G3 is computed adaptively according to:

```
IF MAX( HCLAS, VCLAS ) < THRESH
    R3  = ( HPRED + VPRED )/2
ELSEIF VCLAS < HCLAS
    R3  = VPRED
ELSE
    R3  = HPRED
END
```

Thus, if both classifiers are smaller than the threshold value, an average of both predictor values is computed for R3. If not, then either HPRED or VPRED is used depending on which classifier HCLAS or VCLAS is smaller.

The missing blue values are interpolated in exactly the same way using blue values in place of red. Once completed, the low-resolution intermediate color image has been produced. From there, the low-resolution color differences are computed as previously described.

Image capture devices often have a requirement for providing a low resolution image. Pixels on the image sensor that contribute to a low-resolution image will be referred to as a first two-dimensional array of pixels. This first two-dimensional array of pixels can be all the active pixels on the sensor, or the array can be from a smaller region of the sensor. In any case, pixels in the first two-dimensional array correspond to actual pixels on the image sensor.

Low resolution images from an image capture device are often a small fraction of the full sensor resolution, such as ½ to 1/10 of full resolution. One common use for low resolution images is to provide a stream or sequence of images for analysis and for previewing the scene. For example, a stream of these low resolution images can be displayed on the back of a camera or in an electronic viewfinder. This kind of preview stream has two key characteristics: the images are less than full resolution, and the processing must deliver images at normal video frame rates, such as 30 frames per second. Another example of this requirement is the creation of a video, which is a stream of these low resolution images.

Several methods for combining signals from multiple pixels can be used to produce low-resolution images; however most combining techniques require sampling and conversion of the pixels to be combined, so they do not reduce the overall pixel readout rate. Combining is used herein to denote a more general operation than binning and includes binning as one specific method to combine pixels. Combining the charge from multiple pixels also reduces aliasing in the low-resolution image, since more spatial samples are included in each binned pixel. The term analog combining refers to any approach that combines signal from multiple pixels before converting the combined signal from analog to digital form. One example of this is binning (combining signal in the charge domain).

A pixel produced by the analog combining of signals from multiple pixels in the first two-dimensional array of pixels is referred to as a composite pixel.

In producing a low resolution image from this two-dimensional array of pixels, one method is to simply subsample the full resolution pixels. For example, referring to FIG. 10B, we can select every third pixel on each row of color pixels. This would produce a color image with a Bayer pattern, which is convenient for correction using hardware designed for working with Bayer pattern sensors. Such an image contains no composite pixels.

This approach has substantial image quality problems: it is very prone to aliasing and it is limited to the signal levels in individual pixels. Combining signals from multiple pixels, for example through binning, improves the signal to noise ratio and reduces the tendency to alias.

Analog combining pixel signals before read out addresses three needs. One need is for data reduction to achieve video frame rates, the second is for greater photographic speed, and the third is to achieve better sampling of the full resolution image, for example to reduce aliasing artifacts. However, there is a fourth need for CFA data, that it be evenly spaced. Hardware for video processing is optimized for regularly spaced input data. If non-regularly spaced CFA image data is used instead, then artifacts are produced in the corrected image.

When at least some composite pixels are used to produce a low resolution image derived from a first two-dimensional array of pixels, the resulting image will be referred to as a second two-dimensional array of pixels. The pixels in this second array can include some pixels that are not regularly spaced. To remedy this problem, the second two-dimensional array of pixels is used to compute pixels corresponding to different pixel locations, which are evenly spaced. The resulting image will be referred to as a third two-dimensional array of pixels.

Figure 22A:
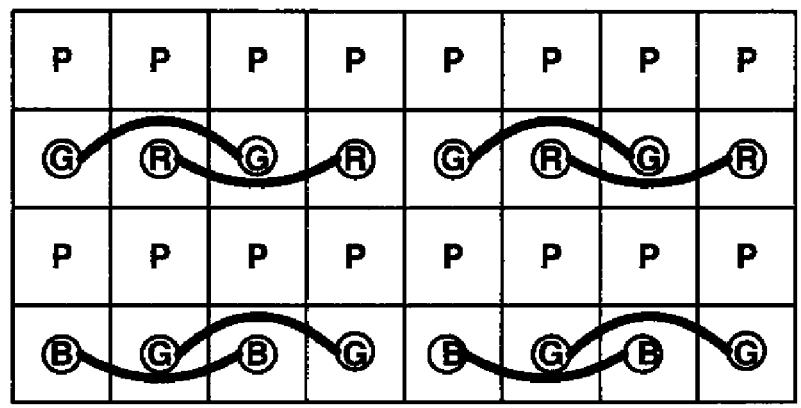
FIGS. 22A-C shows several steps in combining pixels for a specific color filter array pattern.
Figure 22B:
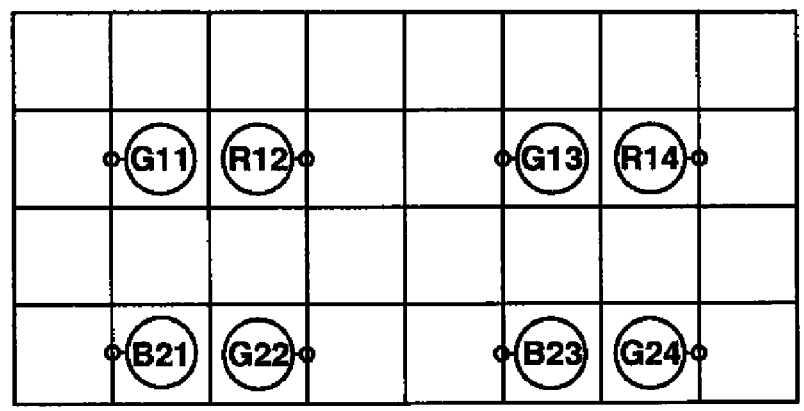
Figure 22C:
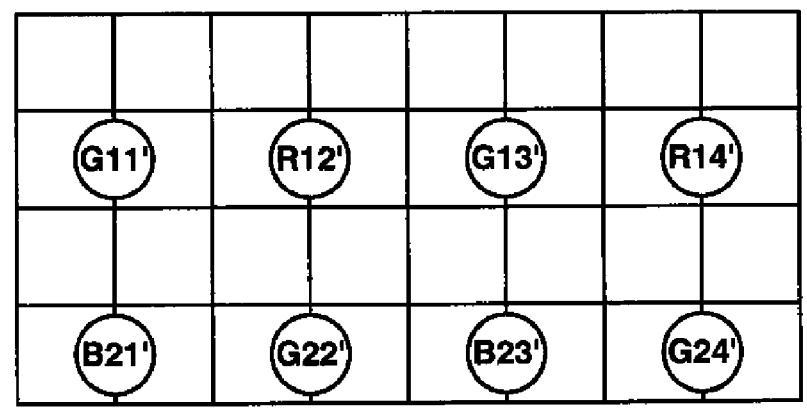

FIGS. 22A-C illustrate a two-dimensional array of pixels having two groups. Pixels from the first group of pixels are color pixels and have a narrower spectral photoresponse than pixels from the second group of pixels. The first group of pixels includes individual pixels that relate to at least two different spectral photoresponses corresponding to at least two color filters. These two groups of pixels are intermixed to improve the overall sensitivity of the sensor.

Referring to FIG. 22A, a portion of a first two-dimensional array of pixels with a CFA pattern is shown containing rows of panchromatic pixels alternating with rows of colored pixels, wherein P represents panchromatic pixels and R, G, and B represent red, green and blue pixels respectively. In general, this pattern has the following minimal repeating unit:

| P | P |
|---|---|
| A | B |
| P | P |
| B | C | wherein P represents pixels of the second group, A represents pixels of a first color of pixels of the first group, B represents pixels of a second color of pixels of the first group, and C represents pixels of a third color of pixels of the first group. For example, the second color pixels B in the general minimal repeating unit correspond to the green pixels in FIG. 22A, though other sets of colors are also used with the present invention.

In FIG. 22A, pairs of color pixels are shown joined by solid lines indicating that analog combination of their color values is performed. The pixels in FIG. 22A are a portion of the first two-dimensional array of pixels. The resulting composite pixels are shown in FIG. 22B where they are located according to the average location of the contributing pixels. For example, in the second row the value G11 is shown in the second column which is the average position of the two contributing green pixels shown in FIG. 22A in the second row and columns one and three. Likewise, color value R12 in column three of FIG. 22B is the result of combining the two red color values shown in columns two and four of FIG. 22A. The pixels in FIG. 22B are a portion of the second two-dimensional array of pixels.

The spacing of these composite pixels is still not ideal, however, because the distances between composite pixels in the horizontal direction are not equal. The small circles attached to the color values in FIG. 22B show the preferred location for the color values. New color values with shifted effective positions can be computed, for example, as follows:

$$R12'=(7*R12+R14)/8$$

and $$G13'=(G11+7*G13)/8$$

The resulting color values R12' and G13' are shown, along with others, in their proper locations in FIG. 22C. Notice that the equation for R12' shows how to shift a color value to the right and that the equation for G13' shows how to shift a color value to the left. These same equations can be used to compute the remaining blue and green color values. The pixels shown in FIG. 22C are a portion of the third two-dimensional array of pixels, which is suitable for correction to a viewable image.

Each pixel in FIG. 22C is based on three full-resolution pixels of the same color. This has the advantage that each composite pixel has noticeably improved signal/noise ratio.

Note that the pattern of colors in the image of combined pixels is a Bayer pattern, convenient for further correction with standard processing.

The analog combining described in FIGS. 22A-C is appropriate for a range of ambient lighting levels, mostly at high ambient lighting levels where relatively little gain is required to achieve good signal/noise ratios.

Figure 23A:
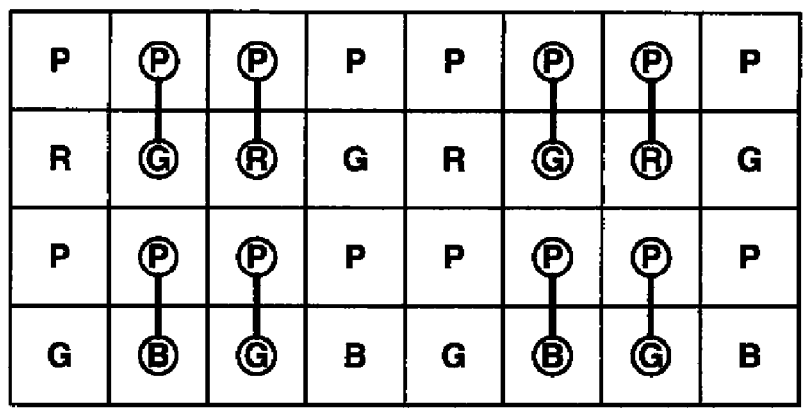
FIGS. 23A-C shows several steps in combining pixels for a specific color filter array pattern.
Figure 23B:
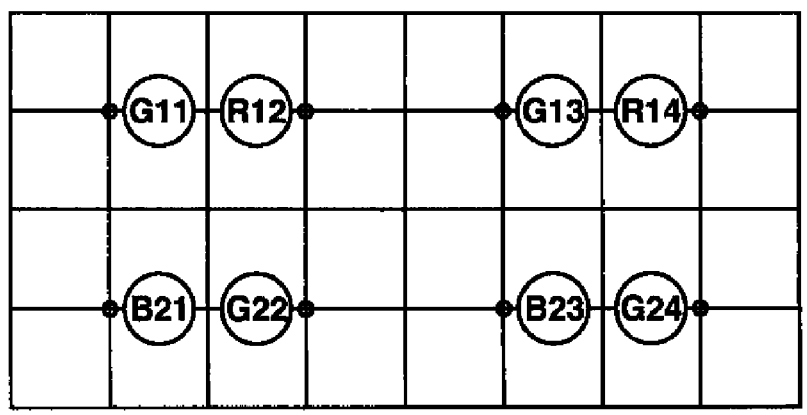

At lower ambient lighting levels, the signal/noise ratios drop. Thus, it is preferred to increase signal/noise ratio by combining different pixels. Referring to FIG. 23A, pixels shown are a portion of a first two-dimensional array of pixels. A CFA pattern is shown wherein pairs of pixels are joined by solid lines indicating that analog combination of pixels in the first two-dimensional array is performed. Because both panchromatic and color pixels are combined, the combined color values correspond to composite spectral responses not achieved by individual pixels in the sensor. The resulting composite pixels are shown in FIG. 23B, where they are located according to the average location of the contributing pixels. For example, in the second column the value G11 is shown at the average position of the two contributing pixels, one panchromatic and one green, shown in the upper left corner of FIG. 23A. Likewise, color value R12 in column three of FIG. 23B is the result of combining the joined panchromatic and red pixels shown in column three of FIG. 23A. The composite pixels in FIG. 23B are a portion of the second two-dimensional array of pixels.

Figure 23C:
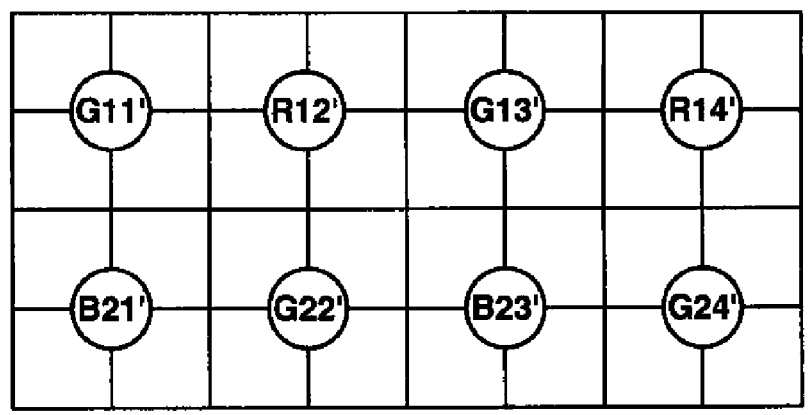

Because the relative spacing of the composite color values is the same as it was for the pattern in FIG. 22A, the same equations hold for computing R12' and G13' as shown in FIG. 23C. As before, FIG. 23C shows a portion of the third two-dimensional array of pixels.

Figure 24A:
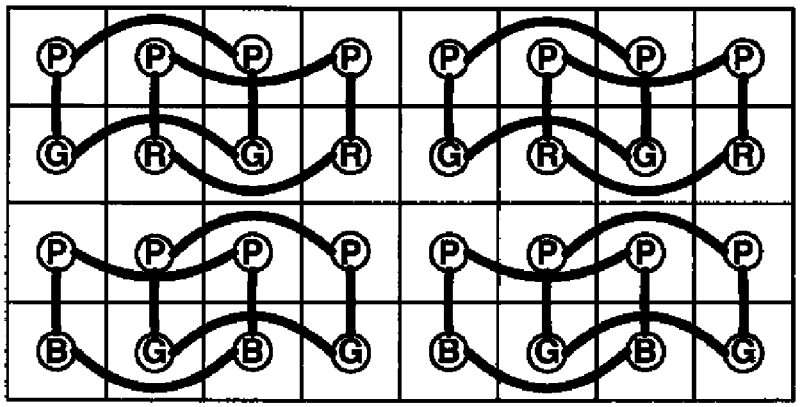
FIGS. 24A-C shows several steps in combining pixels for a specific color filter array pattern.
Figure 24B:
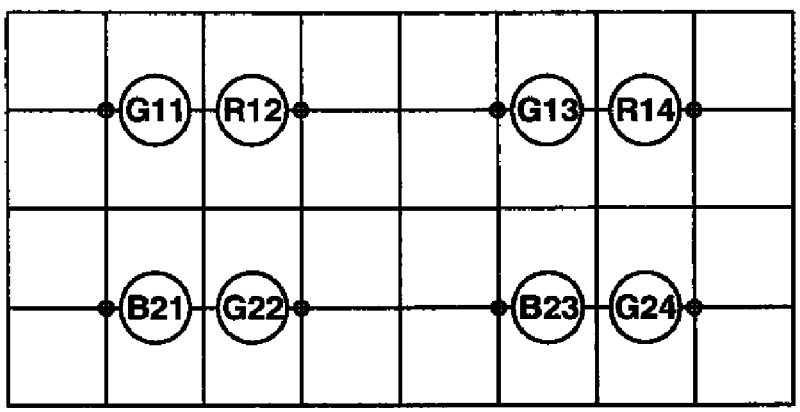

At lower ambient light levels, it is preferred to increase signal/noise ratio further by combining more pixels. Referring to FIG. 24A, a CFA pattern is shown wherein quartets of four pixels are joined by solid lines indicating that analog combination of their color values is performed. Because some of these pixels are panchromatic and some are colored, the combined color values correspond to composite spectral responses not achieved by individual pixels in the sensor. As before, the pixels shown in FIG. 24A are a portion of the first two-dimensional array of pixels. The resulting composite pixels are shown in FIG. 24B, where they are located according to the average location of the contributing pixels. For example, the value G11 is shown in the second column in the average position of the four contributing pixels, two panchromatic and two green, shown in the upper left corner of FIG. 22A. Likewise, color value R12 in column three of FIG. 24B is the result of combining the four contributing pixels, two panchromatic and two red, shown in columns two and four of FIG. 24A. The composite pixels in FIG. 24B are a portion of the second two-dimensional array of pixels.

Figure 24C:
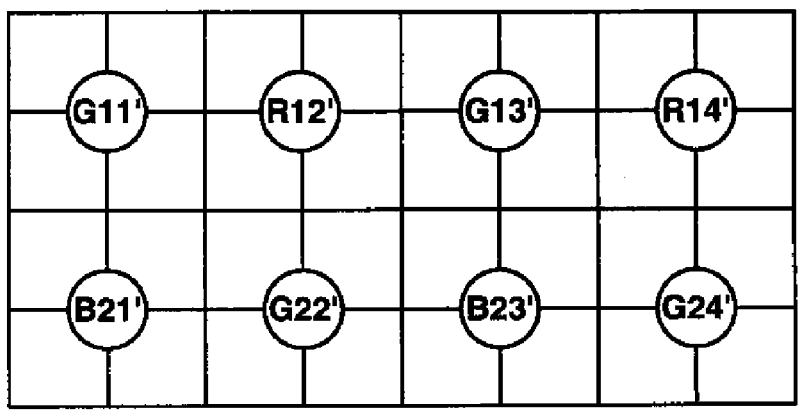

Because the relative spacing of the combined color values is the same as it was for the pattern in FIG. 22A, the same equations hold for computing R12' and G13' as shown in FIG. 24C. As before, FIG. 24C shows a portion of the third two-dimensional array of pixels.

FIGS. 22A-24C describe the present invention as applied to a CFA with a specific minimal repeating unit. CFA patterns with other minimal repeating units are also practiced with the present invention. For example, another minimal repeating unit use with the present invention is:

|   |   |
|---|---|
| P | P |
| A | B |
| P | P |
| P | P |
| B | C |
| P | P | wherein P represents pixels of the second group, A represents pixels of a first color of pixels of the first group, B represents pixels of a second color of pixels of the first group, and C represents pixels of a third color of pixels of the first group.

Another example pattern used with the present invention is the following repeating unit:

| P | A | P | B |
|---|---|---|---|
| P | B | P | C | wherein P represents pixels of the second group, A represents pixels of a first color of pixels of the first group, B represents pixels of a second color of pixels of the first group, and C represents pixels of a third color of pixels of the first group. This pattern is essentially the pattern of FIGS. 22A-24C, but arranged in columns rather than in rows.

A further example is the following repeating unit:

| P | A | P | P | B | P |
|---|---|---|---|---|---|
| P | B | P | P | C | P | wherein P represents pixels of the second group, A represents pixels of a first color of pixels of the first group, B represents pixels of a second color of pixels of the first group, and C represents pixels of a third color of pixels of the first group.

Figure 25A:
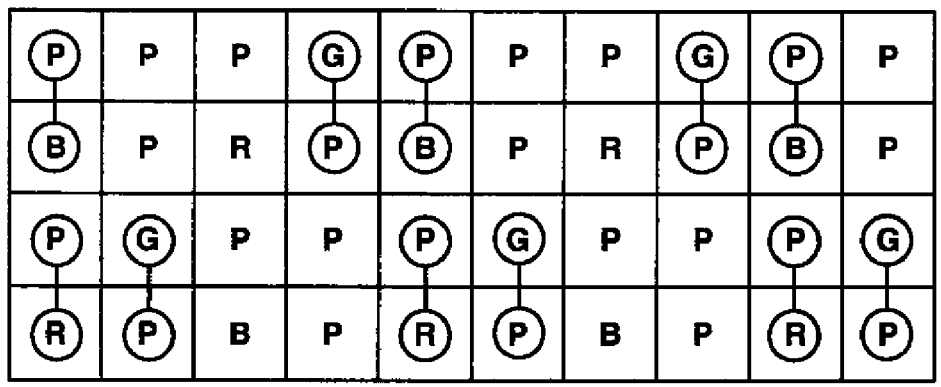
FIGS. 25A-C shows several steps in combining pixels for a specific color filter array pattern.
Figure 25B:
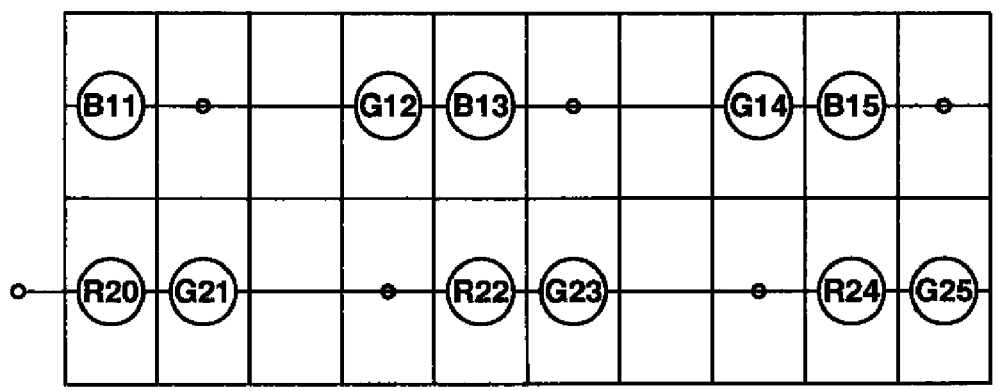

Referring to FIG. 25A, the pixels shown are a portion of a first two-dimensional array of pixels. A CFA pattern is shown wherein five-eighths of the pixels are panchromatic with the remaining pixels equally represented as red, green, and blue color pixels. Some pairs of pixel are joined by solid lines indicating that analog combination of their color values is performed. In each case, a color pixel is combined with a panchromatic pixel The resulting combined color values are shown in FIG. 25B where they are located according to the average location of the contributing pixels. For example, the value G12 is shown in the fourth column in the average position of the two contributing pixels, one panchromatic and one green, shown in the fourth column of FIG. 25A. Likewise, color value B13 in column five of FIG. 25B is the result of combining the two contributing pixels, one panchromatic and one blue, shown in column five of FIG. 25A. The composite pixels in FIG. 25B are a portion of the second two-dimensional array of pixels.

Because the resulting color positions are not regularly spaced, an adjustment is preferred wherein the locations of the red and blue combined values are moved to the small circle positions shown in FIG. 25B. The green values are already in their proper position and need not be moved. New values with shifted effective positions for the red and blue color values can be computed, for example, as follows:

$$B13' = (3*B13 + B15)/4$$

and $$R22' = (R20 + 3*R22)/4$$

Figure 25C:
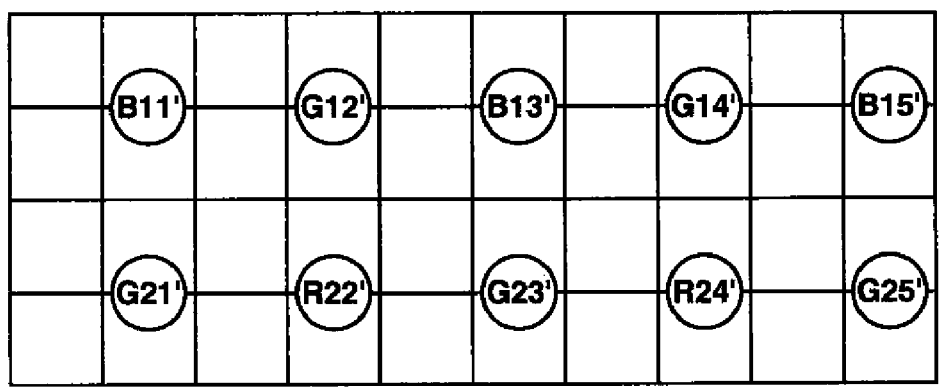

The resulting color values B13' and R22' are shown, along with others, in their proper locations in FIG. 25C. These same equations can be applied in computing the remaining blue and green color values. As before, FIG. 25C shows a portion of the third two-dimensional array of pixels.

When correcting images of combined pixels, the combined pixels shown in FIG. 22C may be balanced and corrected much like individual pixels. The spectral sensitivity of the combined pixels is effectively unchanged by combining these pixels. The combined pixels shown in FIG. 23C require different correction, because combining panchromatic and color pixels changes the effective spectral sensitivity. Those skilled in the art of correction will appreciate that the combined pixels from FIG. 23C are generally less saturated (have more overlap in their spectral sensitivity) than the combined pixels in FIG. 22C. Thus, the correction for FIG. 23C will have to increase color saturation in order to provide a corrected image similar to one produced from FIG. 22C. Because the signal/noise ratio is substantially improved by combining more pixels, the noise amplification from the increasing the color saturation is acceptable. This noise amplification from increasing the color saturation can also be mitigated by changes in noise reduction, sharpening, and other operations. This is one example of correction that is also dependent on ambient lighting level.

Because the combined pixels in FIGS. 23C and 24C are not linear combinations of color pixels, the corrected images from FIGS. 23C and 24C cannot exactly match the corrected image from the combined pixels of FIG. 22C. Still, with some adjustment to the correction, the differences can be mitigated. At very low ambient illumination levels, the desaturation of the combined pixels and poor signal/noise characteristics of the combined pixels will make delivery of a color image undesirable. For example, delivering a grayscale image is preferred to delivering an image with large amounts of colored noise. Prior art has shown that switching to simply using panchromatic pixels can be effective at these very low signal levels.

The preferred embodiment provides a grayscale image using correction that completely desaturates the image, further reducing noise in the process. In the examples shown in FIGS. 22C, 23C and 24C, the combined pixels have a significant change in color reproduction when switching from combining color pixels to combining color pixels and pan pixels. Because abrupt transitions in image characteristics with changing ambient illumination are undesirable, the preferred embodiment smoothes these transitions in color reproduction. For example, the corrected image should gradually change from fully saturated at high ambient light levels to grayscale at very low light levels, with no abrupt transitions. This will typically require abrupt shifts in correction at the light levels where we change the proportions of panchromatic pixels mixed with color pixels.

The invention has been described in detail with particular reference to certain preferred embodiments thereof, but it will be understood that variations and modifications are effected within the spirit and scope of the invention.

PARTS LIST 10 light from subject scene
11 imaging stage
12 lens
13 neutral density filter
14 iris
16 brightness sensor
18 shutter
20 image sensor
22 analog signal processor
24 analog to digital (A/D) converter
26 timing generator
28 image sensor stage
30 digital signal processor (DSP) bus
32 digital signal processor (DSP) memory
36 digital signal processor (DSP)
38 processing stage
40 exposure controller
50 system controller
52 system controller bus
54 program memory
56 system memory
57 host interface
60 memory card interface
62 memory card socket
64 memory card
68 user control and status interface
70 viewfinder display
72 exposure display
74 user inputs
76 status display
80 video encoder
82 display controller
88 image display
100 minimal repeating unit for Bayer pattern
102 repeating unit for Bayer pattern that is not minimal
110 spectral transmission curve of infrared blocking filter
112 unfiltered spectral photoresponse curve of sensor
114 red photoresponse curve of sensor
116 green photoresponse curve of sensor
118 blue photoresponse curve of sensor
120 first green cell
122 red cell
124 blue cell
126 second green cell
202 low-resolution partial color block
204 high-resolution panchrome block
206 low-resolution panchrome block
208 low-resolution color differences block
210 high-resolution color differences block
212 high-resolution final image block
220 first green cell
222 pixel group-green pixels in first green cell
224 red cell
226 blue cell
228 second green cell
230 upper pixel values for interpolating missing green value
232 left pixel values for interpolating missing green value
234 pixel with missing green value
236 right pixel values for interpolating missing green value
238 lower pixel values for interpolating missing green value
240 left pixel values for interpolating missing red value
242 pixel with missing red value
244 right pixel values for interpolating missing red value
250 upper pixel values for interpolating missing red value
252 pixel with missing red value
254 lower pixel values for interpolating missing red value
260 upper pixel values for interpolating missing red value
262 left pixel values for interpolating missing red value
264 pixel with missing red value
266 right pixel values for interpolating missing red value
268 lower pixel values for interpolating missing red value
310 upper left minimal repeating unit
312 upper right minimal repeating unit
314 lower left minimal repeating unit
316 lower right minimal repeating unit
318 example of combining red pixels from vertically adjacent minimal repeating units
320 example of combining green pixels from horizontally adjacent minimal repeating units
330 upper minimal repeating unit
332 left cell in upper minimal repeating unit
334 right cell in upper minimal repeating unit
336 lower minimal repeating unit
338 left cell in lower minimal repeating unit
340 right cell in lower minimal repeating unit
342 example of combining blue pixels from vertically adjacent minimal repeating units
344 example of combining green pixels within a cell of a minimal repeating unit
346 example of combining green pixels both within cells of a minimal repeating unit and between vertically adjacent minimal repeating units

What is claimed is:

1. A method of processing an array of pixels captured by an image capture device, comprising:

(a) providing a first two-dimensional array of pixels from the image capture device, some of which are color pixels, and some of which are panchromatic pixels;

(b) a processing stage for determining in response to ambient lighting conditions, whether panchromatic pixels are to be combined with color pixels;

(c) combining pixels determined from step (b) to produce a second two-dimensional array of pixels which has fewer pixels than the first two-dimensional array of pixels; and (d) correcting the color pixels produced in step c.

2. The method of claim 1 wherein step (a) includes:

(i) providing a two-dimensional array having first and second groups of pixels, arranged in rows and columns, wherein pixels from the first group of pixels have narrower spectral photoresponses than pixels from the second group of pixels and wherein the first group of pixels has pixels that have spectral photoresponses that correspond to a set of at least two colors; and (ii) positioning the first and second groups of pixels to define a pattern that has a minimal repeating unit including at least six pixels, so that at least some rows or columns of the minimal repeating unit are composed only of pixels from the second group and some rows or columns of the minimal repeating unit are composed only of pixels from the first group, wherein the rows or columns that are composed only of pixels from the first group are composed of at most two colors of pixels from the first group.

3. The method of claim 2 wherein the first two-dimensional array has the following minimal repeating unit:

| | |
|---|---|
| P | P |
| A | B |
| P | P |
| B | C | wherein P represents pixels of the second group,
A represents pixels of a first color of pixels of the first group,
B represents pixels of a second color of pixels of the first group, and
C represents pixels of a third color of pixels of the first group.

4. The method of claim 1 wherein ambient lighting conditions are determined from the value in one or more panchromatic pixels.

5. The method of claim 1 wherein step c includes analog combining of color pixels with panchromatic pixels.

6. The method of claim 2 wherein the first two-dimensional array has the following minimal repeating unit:

| | |
|---|---|
| P | P |
| A | B |
| P | P |
| P | P |
| B | C |
| P | P | wherein P represents pixels of the second group,
A represents pixels of a first color of pixels of the first group,
B represents pixels of a second color of pixels of the first group, and
C represents pixels of a third color of pixels of the first group.

7. The method of claim 6 wherein step c includes analog combining of color pixels with panchromatic pixels.

8. The method of claim 2 wherein the first two-dimensional array has the following minimal repeating unit:

| | | | |
|---|---|---|---|
| P | A | P | B |
| P | B | P | C | wherein P represents pixels of the second group,
A represents pixels of a first color of pixels of the first group,
B represents pixels of a second color of pixels of the first group, and
C represents pixels of a third color of pixels of the first group.

9. The method of claim 8 wherein step c includes analog combining of color pixels with panchromatic pixels.

10. The method of claim 2 wherein the first two-dimensional array has the following minimal repeating unit:

| | | | | | |
|---|---|---|---|---|---|
| P | A | P | P | B | P |
| P | B | P | P | C | P | wherein P represents pixels of the second group,
A represents pixels of a first color of pixels of the first group,
B represents pixels of a second color of pixels of the first group, and
C represents pixels of a third color of pixels of the first group.

11. The method of claim 10 wherein step c includes analog combining of color pixels with panchromatic pixels.

12. The processing method of claim 1 wherein step d involves correction that is also dependent on ambient lighting level.

13. A method of converting a high resolution color digital image captured by a electronic sensor into a lower resolution color digital image, including:
   (a) using the electronic sensor to capture a first two-dimensional array of pixels;
   (b) analog combining pixels in the first two-dimensional array of pixels to produce a second two-dimensional array including at least some composite pixels and also having non-regular spacing;
   (c) using a processing stage for computing a third two-dimensional array of pixels with regular spacing; and
   (d) correcting the regularized third two-dimensional array of pixels to produce a corrected image with reduced artifacts.

14. The method of claim 13 wherein there is a stream of digital images, each one of which is processed in accordance with claim 13.

\* \* \* \* \*